US00RE44792E

(19) United States
(12) Reissued Patent
Adam

(10) Patent Number: US RE44,792 E
(45) Date of Reissued Patent: Mar. 4, 2014

(54) RAPID SCATTERING SIMULATION OF OBJECTS IN IMAGING USING EDGE DOMAIN DECOMPOSITION

(75) Inventor: Konstantinos Adam, Belmont, CA (US)

(73) Assignee: The Regents of the University of California, Oakland, CA (US)

(21) Appl. No.: 12/587,415

(22) Filed: Sep. 3, 2009

Related U.S. Patent Documents

Reissue of:
(64) Patent No.: 7,266,480
Issued: Sep. 4, 2007
Appl. No.: 10/677,136
Filed: Sep. 30, 2003

U.S. Applications:
(60) Provisional application No. 60/415,510, filed on Oct. 1, 2002.

(51) Int. Cl.
*G06F 17/50* (2006.01)
*G03F 1/36* (2012.01)

(52) U.S. Cl.
USPC ..... 703/2; 703/6; 703/17; 703/19; 716/53; 430/5

(58) Field of Classification Search
USPC ..... 703/2, 6, 17, 19; 716/2, 4, 52, 53; 430/5, 40
See application file for complete search history.

(56) References Cited

U.S. PATENT DOCUMENTS

| | | | | |
|---|---|---|---|---|
| 5,447,810 | A * | 9/1995 | Chen et al. | 430/5 |
| 6,738,859 | B2 * | 5/2004 | Liebchen | 716/51 |
| 7,030,997 | B2 | 4/2006 | Neureuther et al. | |
| 7,155,698 | B1 | 12/2006 | Gennari | |
| 7,266,480 | B2 * | 9/2007 | Adam | 703/2 |
| 7,467,072 | B2 | 12/2008 | Adam | |
| 2003/0064298 | A1 * | 4/2003 | Broeke et al. | 430/5 |
| 2005/0198598 | A1 * | 9/2005 | Adam | 716/4 |
| 2005/0283747 | A1 * | 12/2005 | Adam | 716/4 |
| 2007/0213962 | A1 * | 9/2007 | Adam | 703/2 |
| 2009/0217218 | A1 * | 8/2009 | Adam | 716/2 |

OTHER PUBLICATIONS

Adam et al., "Methodology for Accurate and Rapid Simulation of Large Arbitrary 2D Layouts of Advanced Photomasks", 21st Annual Bacus Symposium on Photomask Technology, Oct. 3, 2001.

(Continued)

*Primary Examiner* — Thai Phan
(74) *Attorney, Agent, or Firm* — Stolowitz Ford Cowger LLP

(57) ABSTRACT

A complex two-dimensional layout of a photomask or other three-dimensional object is systematically decomposed into a finite number of elementary two-dimensional objects with the ability to cause one-dimensional changes in light transmission properties. An algorithmic implementation of this can take the form of creation of a look-up table that stores all the scattering information of all two-dimensional objects needed for the synthesis of the electromagnetic scattered field from the original three-dimensional object. The domain is decomposed into edges, where pre-calculated electromagnetic field from the diffraction of isolated edges is recycled in the synthesis of the near diffracted field from arbitrary two-dimensional diffracting geometries. The invention has particular applicability in die-to-database inspection where an actual image of a mask is compared with a synthesized image that takes imaging artifacts of comers, edges and proximity into account. Another application is optical proximity correction which consists of evaluating the image of every feature on a mask and improving it by introducing edge shifts and iteratively adjusting the amounts of these shifts.

107 Claims, 23 Drawing Sheets

(56) References Cited

OTHER PUBLICATIONS

Konstantinos Adam, "Domain Decomposition Methods for the Electromagnetic Simulation of Scattering From ThreeDimensional Structures With Applications in Lithography", A dissertation submitted in Fall 2001 to the University of California, Berkeley.

Adam et al., "Efficient Phase Defect Modeling Using Domain Decomposition Methods", EIPBN Conference, May 2002.

Adam et al., "Simplified Models for Edge Transitions in Rigorous Mask Modeling", 26th Annual International Symposium on Microlithography, Mar. 1, 2001.

Stolowitz Ford Cowger LLP, "Listing of Related Cases", Jul. 31, 2013, 1 page.

Adam et al., "*Efficient Phase Modeling using Domain Decomposition Methods*", EIPBN Conference, May 2002.

* cited by examiner

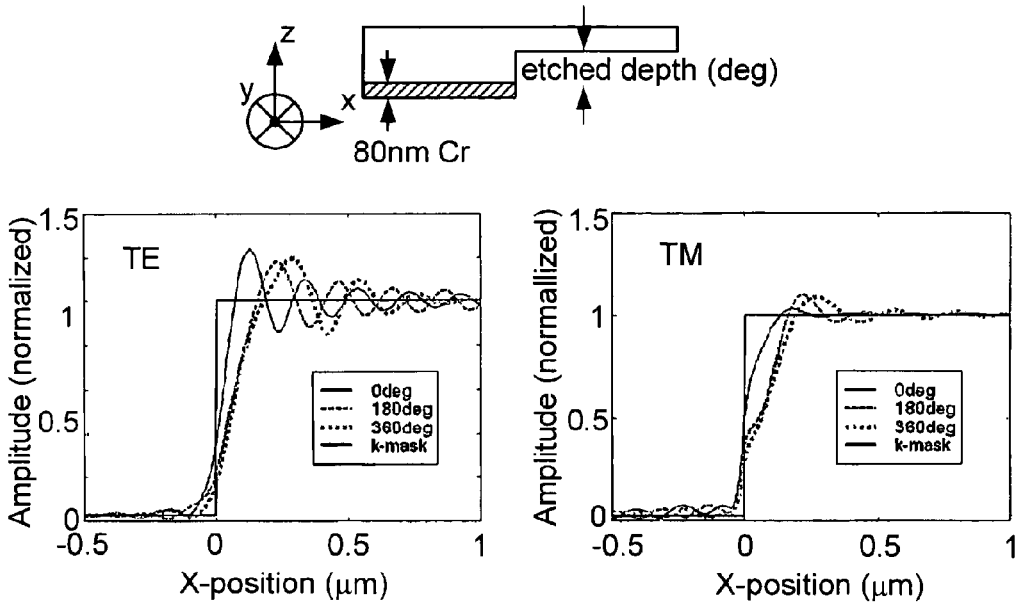
FIG. 8A
FIG. 8B
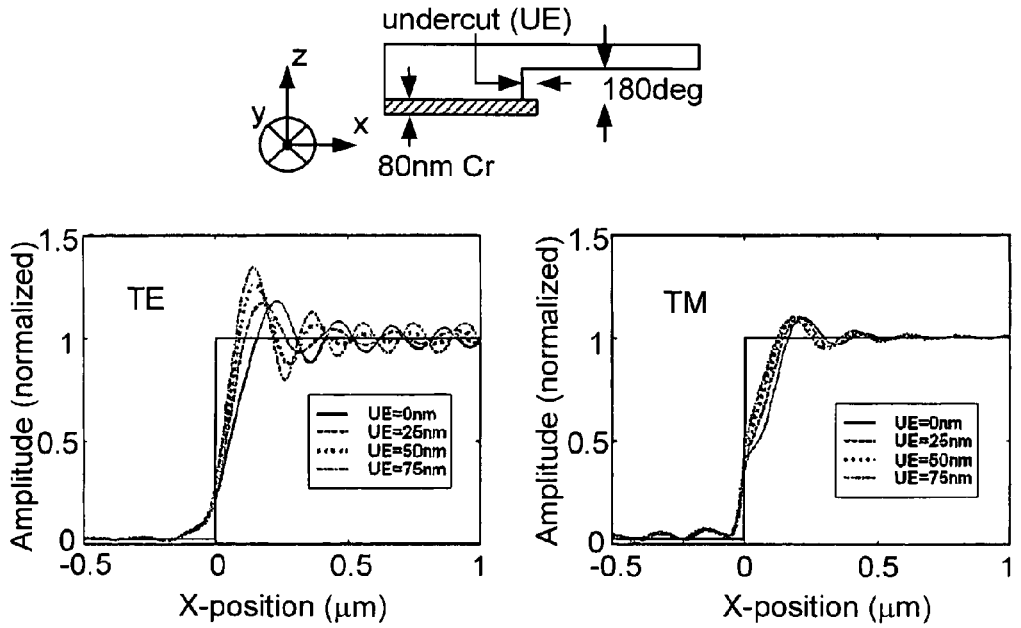
FIG. 8C
FIG. 8D

NMSE(propagated orders) = 2.2%

NMSE(collected orders) = 2e-4

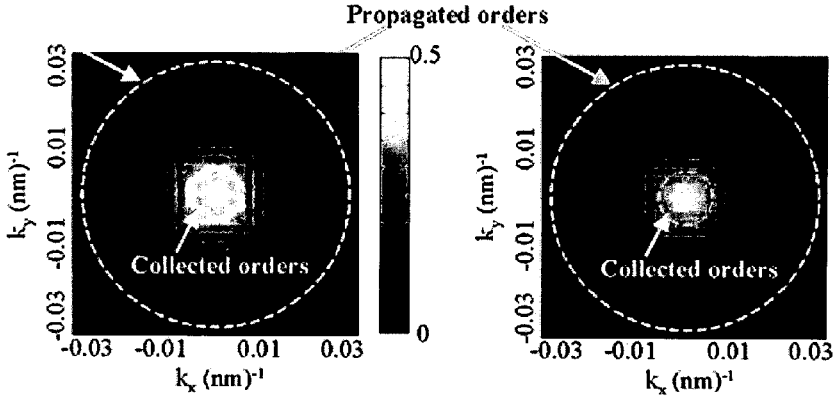
FIG. 15A
FIG. 15B
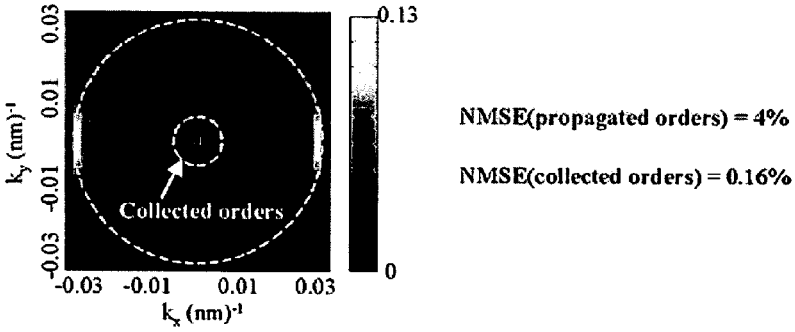
FIG. 15C

NMSE(propagated orders) = 5.7% (was 2.2%)

NMSE(collected orders) = 8.6e-4 (was 2e-4)

RAPID SCATTERING SIMULATION OF OBJECTS IN IMAGING USING EDGE DOMAIN DECOMPOSITION

Matter enclosed in heavy brackets [ ] appears in the original patent but forms no part of this reissue specification; matter printed in italics indicates the additions made by reissue.

CROSS-REFERENCE TO RELATED APPLICATIONS

[This patent application] *This application is a Reissue Application of its parent application Ser. No. 10/677,136, filed on Sep. 30, 2003, now U.S. Pat. No. 7,266,480 which* claims priority from Provisional Patent Application No. 60/415,510 filed Oct. 1, 2002 for "METHOD FOR RAPID SCATTERING SIMULATION OF OBJECTS IN IMAGING VIA DOMAIN DECOMPOSITION AND SPECTRAL MATCHING," and is related to application Ser. No. 10/241,242 filed Sep. 10, 2002 for "CHARACTERIZING ABERRATIONS IN AN IMAGING LENS AND APPLICATIONS TO VISUAL TESTING AND INTEGRATED CIRCUIT MASK ANALYSIS," *all of* which are incorporated herein by reference for all purposes.

BACKGROUND OF THE INVENTION

This invention relates generally to optical imaging systems, and more particularly the invention relates to simulation and modeling of electromagnetic scattering of light in such imaging systems. The invention has applicability to optical proximity correction in photo masks and mask image inspection, but the invention is not limited thereto.

The general components of an optical lithography tool, shown schematically in the diagram of FIG. 1 are the illumination system, the projection system, the photomask (also called reticle), and the photoresist, spun on top of a semiconductor wafer. The operation principle of the system is based on the ability of the resist to record an image of the pattern to be printed. The mask, already carrying this pattern, is flooded with light and the projector forms an image of all mask patterns simultaneously onto (and into) the resist. The inherent parallelism of this process is the main reason why optical photolithography is favored over any other lithography, since it facilitates a very high throughput of 30-120 wafers per hour. The light intensity distribution on top of the resist surface is commonly referred to as aerial image. The resist itself is a photosensitive material whose chemical composition changes during light exposure. The pattern is thereby stored in form of a latent (bulk) image within the resist. After exposure has occurred, the resist is developed by means of a chemical process that resembles the process of developing photographic film. After development, the exposed parts of the resist remain or dissolve depending on its polarity (negative or positive, respectively). The end-result of the lithography process is a more or less exact (scaled or not) replica of the mask pattern on the wafer surface that will play the role of a local protective layer (mask) for subsequent processing steps (etching, deposition, implantation).

The role of the illumination system is to deliver a light beam that uniformly trans-illuminates the entire reticle. See FIG. 2(a). It typically consists of various optical elements, such as lenses, apertures, filters and mirrors. The light source is responsible for generating very powerful and monochromatic radiation. Power is necessary because it is directly related to throughput. Monochromaticity is important because high quality refractive (or reflective, in the case of EUV lithography) optics can only be fabricated for a very narrow illumination bandwidth. State-of-the-art optical lithography tools employ excimer lasers as their light source. Deep Ultra Violet (DUV) lithography is the term used for lithography systems with illumination wavelengths $\lambda$=248 nm (excimer laser with KrF), $\lambda$=193 nm (excimer laser with ArF) and $\lambda$=157 nm (excimer laser with $F_2$). The successful development of current and future optical photolithography technologies is hinged upon research advances in both excimer laser technology and novel materials that possess the required properties (high optical transmission at DUV wavelengths, thermal properties, stability after heavy DUV radiation exposure) by which the optical elements of the system will be made.

All illumination systems in optical projection printing tools are designed to provide what is known as Köhler illumination. By placing the source or an image of the source in the front focal plane of the condenser column, the rays originating from each source point illuminate the mask as a parallel beam, as seen in FIG. 2. Here, each source point emits a spherical wave that is converted by the illumination system into a plane wave incident on the object (photomask). The angle of incidence of the plane wave depends on the location of the source point ($\alpha$,$\beta$) with respect to the optical axis (0,0). Each parallel beam is a plane wave whose direction of propagation depends on the relative position of the source point with respect to the optical axis. Nonuniformity in the brightness of the source points is averaged out so that every location on the reticle receives the same amount of illumination energy. As we will see in subsequent Sections Köhler illumination can be modeled in a concise mathematical way.

In addition to dose uniformity, the lithography process should also maintain directional uniformity such that the same features are replicated identically regardless of their orientations. The shape of the light source is therefore circular (or rotationally symmetric) in traditional optical lithography, although this is not true for certain advanced illumination schemes such as quadrupole illumination, where directional uniformity is sacrificed in order to maximize the resolution of features with certain orientations.

The coherence of the light source is another important attribute. Temporal coherence is usually not a big concern, since the narrow bandwidth of excimer lasers implies high temporal coherence. Spatial coherence (or just plain coherence) on the other hand is always carefully engineered and, in most cases, adjustable. Using special scrambling techniques, the light emitted from any point of the source is made completely uncorrelated (incoherent) to the light emitted from every other point. However, light gathers coherence as it propagates away from its source. The frequently quoted partial coherence factor a is a characteristic of the illumination system and is a measure of the physical extent and shape of the light source. The larger the light source, the larger the partial coherence factor, and the light source has a lower degree of coherence. In the limit of an infinite source, imaging is incoherent and $\sigma=\infty$. On the other hand, the smaller the light source, the smaller the partial coherence factor, and the higher the degree of coherence. Imaging with a point source is fully coherent and $\sigma=0$. Note that a point source in a Köhler illumination will result in a single plane wave illuminating the mask and the angle of incidence of this wave depends on the relative position of the point source with respect to the optical axis. For partial coherence factors between zero and infinity, imaging is partially coherent. Typical partial coherence factors in optical lithography range from 0.3 to 0.9.

The projection system typically consists of a multi-element lens column (up to 30-40 lenses) that may also have apertures, filters, or other optical elements, and it is a marvel of engineering precision in order to be able to reliably project images with minimum dimensions on the order of 100 nm for state-of-the-art systems. One of the main reasons for the required high precision is control of the aberrations or deviations of the wavefront from its ideal shape. Two relevant parameters of the projection system are the numerical aperture, NA, and the reduction factor, R. The numerical aperture is, by definition, the sine of the half-angle of the acceptance cone of light-rays as seen from the image side of the system. The ratio of image-height to object-height is, by definition, the magnification factor M of the system. The inverse of the magnification factor is the reduction factor, R. Since a typical system in photolithography projects at the image plane a scaled-down version of the object (mask), M is less than 1 and R is greater than 1. State-of-the-art systems currently have reduction factors of R=4 or 5. Note that two numerical apertures exist in the projection system, namely $NA_i$ (or simply NA) and $NA_o$, which refer to the half-angle of the acceptance cone as seen from the image side and from the object (mask) side, respectively. They are related through the reduction factor as follows:

$$R = \frac{NA_i}{NA_o}. \qquad \text{Equation 2-1}$$

For a circularly shaped light source, the partial coherence factor σ mentioned above is related to the numerical apertures of both the projection system and the illumination system. Specifically, σ is given by:

$$\sigma = \frac{NA_c}{NA_p}. \qquad \text{Equation 2-2}$$

where $NA_c$ is the numerical aperture of the condenser lens (illumination system) and $NA_p$ is the numerical aperture of the projector lens. Some confusion arises from the fact that, in the above equation, the reduction factor of the imaging system is implicitly taken into account. FIG. 2(b) clarifies the situation by showing simplified diagrams of two optical systems with parameters NA=0.5, σ=0.5 and R=5 or R=1.

The photomask, also called reticle, carries the pattern to be printed at a given lithography processing step. The masks of integrated circuits having large die-sizes or footprints (that is, occupying large areas on the semiconductor wafer), typically carry just one copy of the chip pattern. A matrix of several chip patterns is contained in one mask whenever the chip size permits. Note that the mask is drawn R times the actual size on the semiconductor wafer, since the dimensions of the circuit will be scaled down by the reduction factor, R. For this reason it is not sufficient to just provide feature sizes, since it may not be immediately obvious from the context whether these are photomask (object) or resist (image) sizes. A typical convention for distinguishing photomask feature sizes from resist feature sizes is to include in parenthesis the reduction factor R. For example, a 600 nm (4×) line has a size of 600 nm on the mask, and would produce a 600 nm/4=150 nm line if used in a 4×imaging system. Similarly, a 130 nm (1×) line refers to the size of a line at the image (wafer) plane and would result from the printing of a 130 nm line on the mask for a system with R=1, or a 520 nm (4×130 nm) line on the mask for a system with R=4, or a 1.3 μm (10×130 nm) line on the mask for a system with R=10.

Depending on their operation principle, photomasks can be divided into two broad categories: conventional binary or chrome-on-glass (COG) masks and advanced phase-shifting masks (PSM).

A binary or COG mask consists of a transparent substrate (mask blank), covered with a thin opaque film that bears the desired pattern. Light can either pass unobstructed through an area not covered by the opaque film or be completely blocked if it is incident on an area that is protected by the film. This binary behavior of the transmission characteristic of the mask is responsible for its name. The mask blank for DUV lithography typically consists of fused silica glass that has excellent transmission at λ=248 nm and somewhat poorer but acceptable transmission at λ=193 nm and λ=157 nm. The opaque film is typically on the order of 100 nm thick and has a chromium (Cr) composition.

Adding phase modulation to the photomask can profoundly increase the attainable resolution. This is the principle followed by phase-shifting masks (PSM), which employ discrete transmission and discrete phase modulation. There are many different flavors of PSMs depending on the way that the phase modulation is achieved. One of the most promising PSM technologies is what is known as alternating phase-shifting mask (alt. PSM, or APSM). Here are cut-planes of geometry of a binary (COG) mask (a) and an alternating phase-shift mask (b). The ideal electric field distribution for the binary mask (c) leads to a poor image intensity distribution (e) at the image plane, whereas the ideal electric field distribution for the alt. PSM (d), because of destructive interference, leads to a robust image. The principle of an alt. PSM is compared with that of a binary mask in FIG. 3. The center line is bordered by transmitting regions with 180° phase difference on an alt. PSM and by clear areas of the same phase on a binary mask. The phase difference on the alt. PSM leads to destructive interference, resulting in a sharp dark image. The binary mask image is not as sharp because of the lack of phase interaction. The 180° phase difference is created by etching trenches, also called phase-wells, into the fused silica substrate during the alt. PSM fabrication process, which is now more complex than the COG fabrication process. The difference in the amount of material removed $d_{etch}$ is such that the path length difference between light passing through the different phase regions is half of the wavelength in air.

Sub-wavelength lithography, where the size of printed features is smaller than the exposure wavelength, places a tremendous burden on the lithographic process. Distortions of the intended images inevitably arise, primarily because of the nonlinearities of the imaging process and the nonlinear response of the photoresist. Two of the most prominent types of distortions are the wide variation in the linewidths of identically drawn features in dense and isolated environments (dense-iso bias) and the line-end pullback or line-end shortening (LES) from drawn positions. The former type of distortion can cause variations in circuit timing and yield, whereas the latter can lead to poor current tolerances and higher probabilities of electrical failure.

Optical proximity correction or optical proximity compensation (OPC) is the technology used to compensate for these types of distortions. OPC is loosely defined as the procedure of compensating (pre-distorting) the mask layout of the critical IC layers for the lithographic process distortions to follow. This is done with specialized OPC software. In the heart of the OPC software is a mathematical description of the process distortions. This description can either be in the form of simple shape manipulation rules, in which case the OPC is referred to as "rule-based OPC," or a more detailed and intricate process model for a "model-based OPC." The OPC software automatically changes the mask layout by moving segments of line edges and adding extra features that (pre-) compensate the layout for the distortions to come. Although after OPC has been performed the mask layout may be quite different than the original (before OPC) mask, the net result of this procedure is a printed pattern on the wafer that is closest to the IC designer's original intent.

In the early 1990's the problem of OPC for large mask layouts was addressed formally as an optimization problem. The size of such a problem is formidable, but through introduction of appropriate constraints—induced primarily from mask fabrication constraints, local optimal mask "points" were successfully demonstrated. This research has led to commercially available software tools that perform OPC on a full-chip scale. All three approaches rely heavily on speedy calculations of the image intensity at selected points of the image field. Although the methods by which they achieve this appear seemingly different, they are nevertheless the same, in the sense that they all rely on a decomposition of the kernel of the imaging equation for partially coherent light.

Domain decomposition techniques, where a large electromagnetic problem is broken up into smaller pieces and the final solution is arrived at by synthesizing (field-stitching) the elemental solutions, have been proposed for the study of one-dimensional binary (phase only) diffractive optical elements. Others working on the same problem have demonstrated how to create and use a perturbation model for binary edge-transitions based on the product of the ideal, sharp transition and the continuous field variations in the vicinity of the edge. Independently, a similar technique to field-stitching has been proposed for the simulation of two-dimensional layouts of advanced photomasks (alternating PSM, masks with OPC) that properly models interactions from neighboring apertures and furthermore takes advantage of the spectral properties of the diffracted fields to come up with a compact model for the edge-transitions.

The present invention is directed to an improved methodology for OPC on optical masks.

SUMMARY OF THE INVENTION

In accordance with the invention, a complex two-dimensional layout of a photomask or other three-dimensional object is systematically decomposed into a finite number of elementary two-dimensional objects with the ability to cause one-dimensional changes in light transmission properties. An algorithmic implementation of this can take the form of creation of a look-up table that stores all the scattering information of all two-dimensional objects needed for the synthesis of the electromagnetic scattered field from the original three-dimensional object.

More particularly, the domain is decomposed into edges, where pre-calculated electromagnetic field from the diffraction of isolated edges is recycled in the synthesis of the near diffracted field from arbitrary two-dimensional diffracting geometries. In this invention, the sum of the complex fields is taken rather than the product due to the linearity of the Kirchoff-Fresnel diffraction integral, which makes the decomposition method possible.

The invention has particular applicability in die-to-database inspection where an actual image of a mask is compared with a synthesized image that takes imaging artifacts of corners, edges and proximity into account. A very important current challenge in synthesizing images is the correct evaluation of electromagnetic effects at edges of phase-shifted mask features. These electromagnetic effects are a strong function of the edge topography of the nonplanar features introduced during the mask writing process. The inspection of every feature on a 50M transistor chip must be accomplished in an inspection time on the order of 5 hours for feature sizes of 100 nm. Future inspection rates are expected to hit 200M inspection pixels per hour, which would allow a mask with 50 nm features and 200M transistors to be inspected at a pixel size of 25 nm in about 5 hours.

Another application is optical proximity correction which consists of evaluating the image of every feature on a mask and improving it by introducing edge shifts and iteratively adjusting the amounts of these shifts. A typical OPC correction process on a 50M transistor mask takes about a full day. Since the number of iterations in the OPC shifts is on the order of 5 the full mask image is computed on average roughly at the same speed of the die-to-database inspection, or 50M transistors every 5 hours for the 100 mn generation and 200M transistors per hour for the 50 nm generation.

The invention and objects, features and applications thereof will be more apparent from the following detailed description and appended claims when taken with the drawings.

BRIEF DESCRIPTION OF THE DRAWINGS

FIGS. 8(a)-8(d) illustrate dependence of edge scattering on edge profile and polarization.

FIGS. 15(a)-15(c) illustrate edge domain decomposition applied on an isolated square island (spectrum).

DETAILED DESCRIPTION OF ILLUSTRATIVE EMBODIMENTS

Adam and Neureuther, "SIMPLIFIED MODELS FOR EDGE TRANSITIONS IN RIGOROUS MASK MODELING," 26$^{th}$ Annual International Symposium on Microlithography, Mar. 1, 2001, discloses domain decomposition methods (DDM) that allow the division of a larger mask diffraction problem into a set of constituent parts or single openings in the mask.

The present invention provides an extension of the disclosed domain decomposition methods (DDM). A domain decomposition method based on edges uses pre-calculated electromagnetic field from the diffraction of isolated edges which is recycled in the synthesis of the near diffracted field from arbitrary two-dimensional diffracting geometries. Although at first glance it might be tempting to discard edge-decomposition techniques as inaccurate for masks with large vertical topography and features with small lateral dimensions, it will be shown that for a large set of practical situations, they are accurate. A key difference in this method from the prior art is that the sum of the complex fields is taken instead of the product. The reason for this is in the linearity of the Kirchhoff-Fresnel diffraction integral, and this linearity makes possible the decomposition method.

Figure 1:
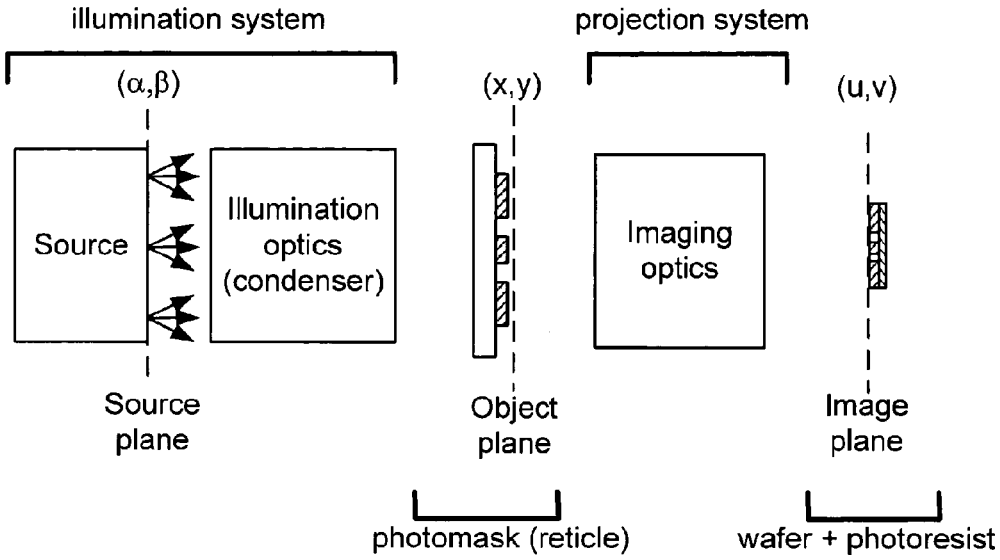
FIG. 1 is a general diagram of an optical photolithography tool.
Figure 2A:
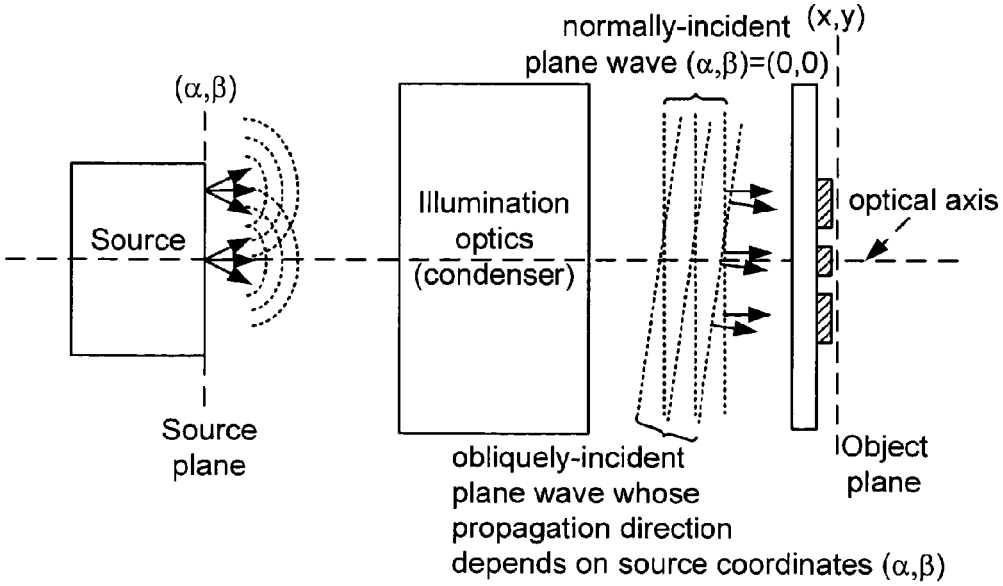
FIG. 2(a) illustrates the illumination system of FIG. 1 with Köhler's method.
Figure 2B:
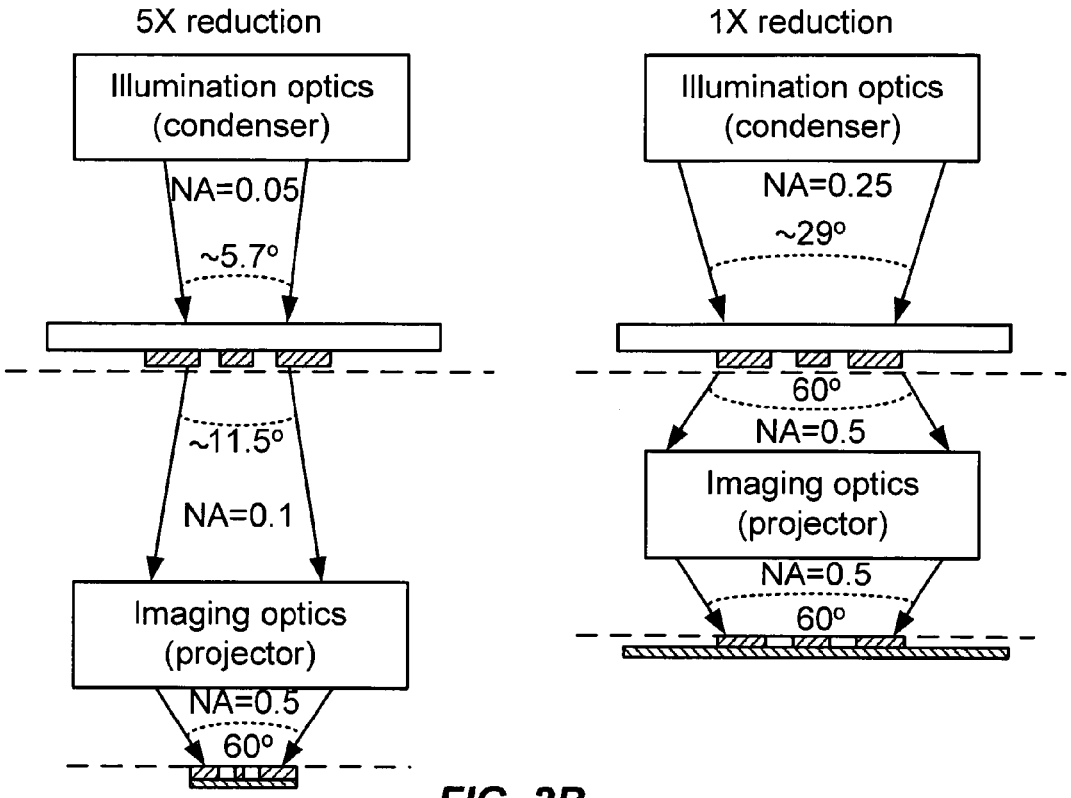
FIG. 2(b) illustrates numerical apertures of illumination and projection lenses in the tool of FIG. 1.
Figure 4:
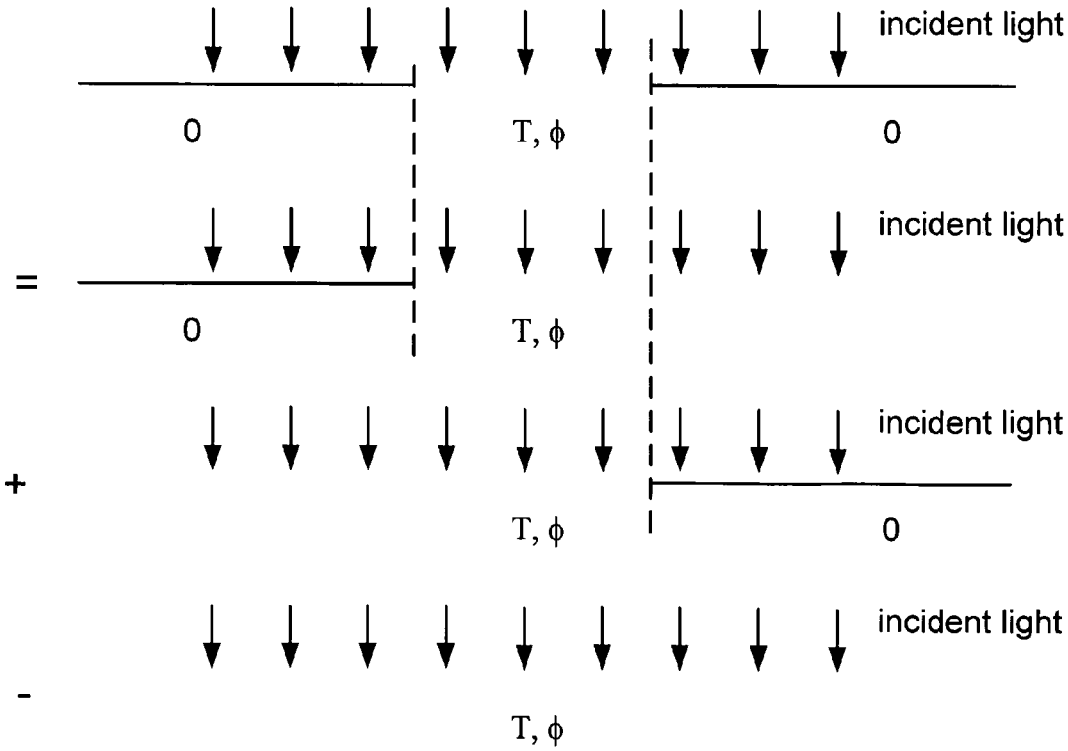
FIG. 4 illustrates light decomposition of an opening into two edges.
Figure 3A:
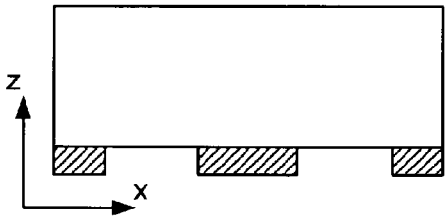
FIGS. 3(a)-3(f) are a comparison of operational principles of an alternating phase shift mask (alt. PSM) and a binary (COG) mask as used in the invention.
Figure 3B:
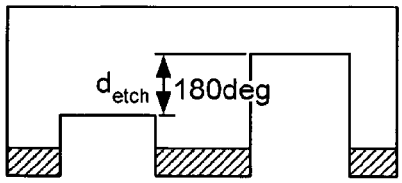
Figure 3C:
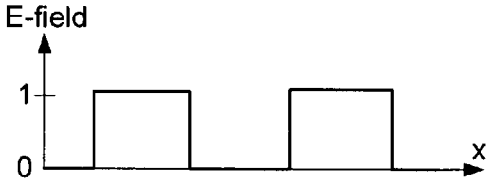
Figure 3D:
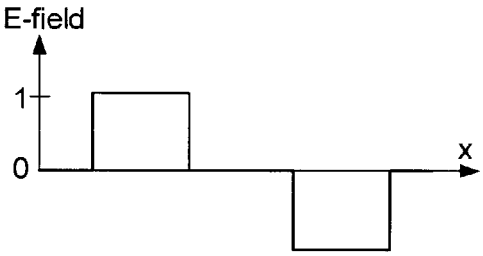
Figure 3E:
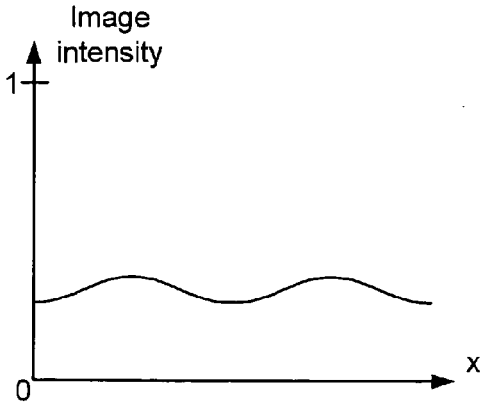
Figure 3F:
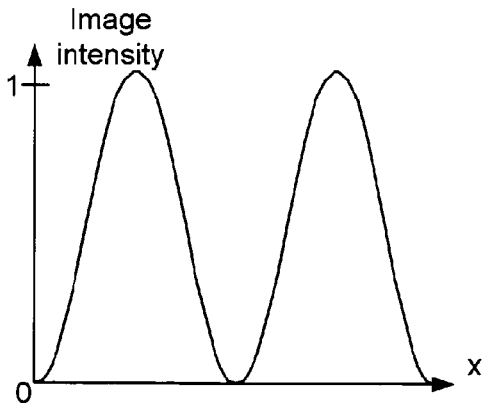

A natural extension of the DDM that is also based on the linearity of the Kirchhoff-Fresnel diffraction integral is shown in FIG. 4. An opening with transmission T and phase $\phi$ in an infinitely thin, opaque screen can be decomposed by way of the linearity of the Kirchhoff-Fresnel diffraction integral into two edges. The uniform plane wave illumination is subtracted to restore the light level everywhere. The 1D mask layout is first decomposed into single opening masks, as noted above, and subsequently each opening is decomposed into two edges and a uniform illumination field as in FIG. 4. Such a decomposition can be proven to be exact for infinitely thin and perfectly conducting screens through the use of the electromagnetic form of Babinet's principle, but it should break down if applied to photomasks with "thick" vertical structures (compared to $\lambda$) and not perfectly absorbing screen materials. Also, because of the reduced ability of light to penetrate through small (compared to $\lambda$) openings, it is expected to break down for small mask features. This decomposition method will be hereafter referred to as the edge domain decomposition method or edge-DDM. The application of the edge-DDM to a single isolated space and an isolated line are described next, followed by a systematic evaluation of the limits of applicability of the method.

Figure 5A:
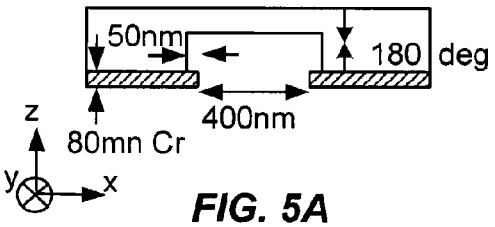
FIGS. 5(a)-5(f) illustrate an edge domain decomposition method in accordance with the invention.
Figure 5B:
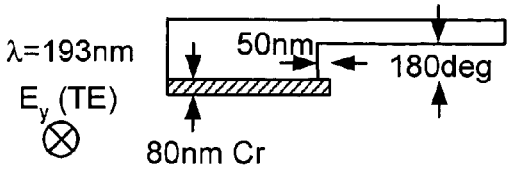
Figure 5C:
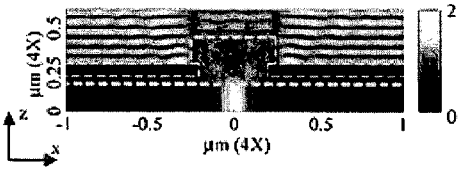
Figure 5D:
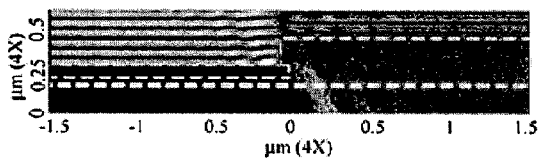
Figure 5E:
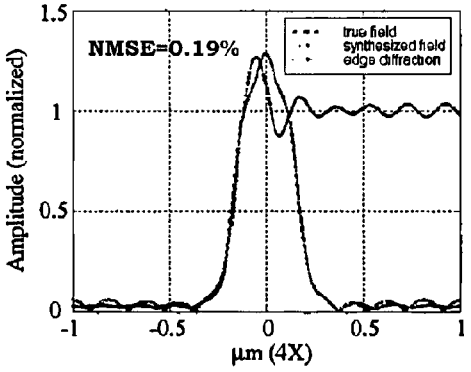
Figure 5F:
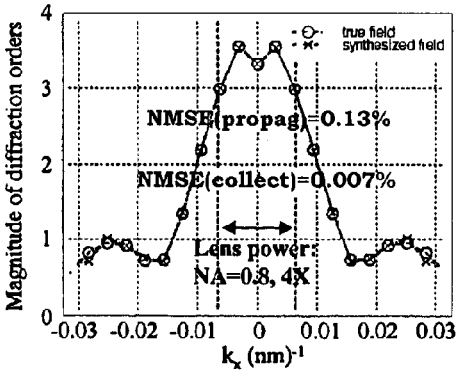

Consider the isolated mask space (opening) shown in FIGS. 5(a)-5(f). The amplitude of the complex Ey-field under Ey (TE) illumination is shown in FIG. 5(c) and the scattered field across the observation plane is shown in FIG. 5E. According to FIG. 4, the field across the observation plane can be alternatively obtained by using the scattered field from an edge that has the same vertical profile as the space, as shown in FIGS. 5(b) and 5(d). The resulting field from this edge-DDM is overlaid on the plot of FIG. 5E along with the field from the edge-scattering. The normalized mean square error 1 (NMSE) between the r-mask and the edge-DDM is 0.19%. In FIG. 5(f) the spectra of the r-mask and edge-DDM are compared and it is seen that they differ by 0.13% in a NMSE sense if the whole spectrum of propagating waves is considered and by merely 0.007% within the collection ability of a projection system with NA=0.8 and R=4. Since only the portion of the spectrum that is collected by the projection system contributes to the image formation, the exceptional accuracy of the edge-DDM is this regime is more than adequate for accurate image simulations.

Figure 6A:
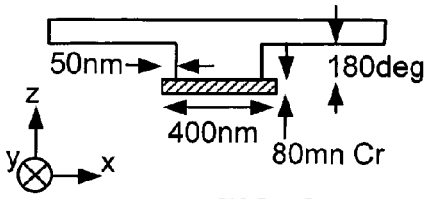
FIGS. 6(a)-6(f) illustrate an edge domain decomposition method applied on an isolated line.
Figure 6B:
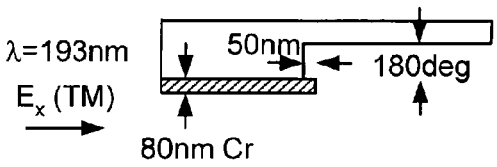
Figure 6C:
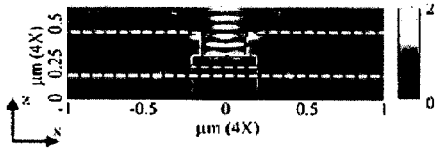
Figure 6D:
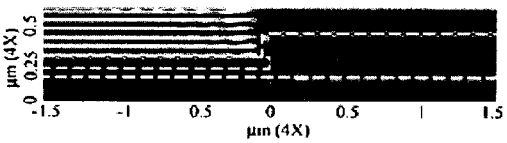
Figure 6E:
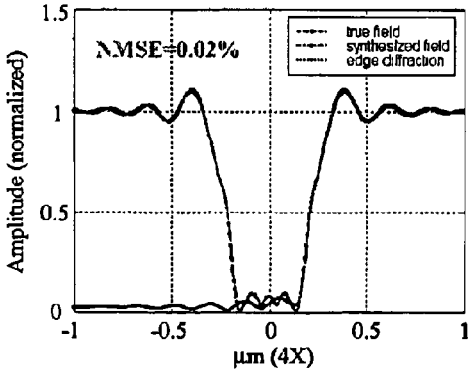
Figure 6F:
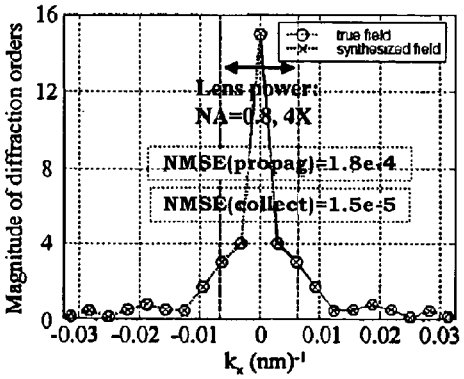

Similar steps can be followed for the isolated line shown in FIG. 6(a) illuminated with Ex (TM) polarized light. Note that it is not typical to have a line as shown here, where in both sides the glass has been etched. Normally only one side of the line is phaseshifted, but this example simply aims to introduce the principle of the edge-DDM. A line with one side phase-shifted and the other left intact can still be decomposed via the edge-DDM using the diffraction fields from the two different edges. The amplitude of the complex Ex field everywhere in the domain of FIG. 6(a) is shown in FIG. 6(c) and for the edge of FIG. 6(b) in FIG. 6(d) respectively. The true (r-mask) scattered field is compared with the synthesized field with edge-DDM in FIG. 6(e) and the spectra are compared in FIG. 6(f). The error (NMSE) is seen to be small in both the near field and spectra plots and specifically the error of the through-the-lens (TTL) spectrum is just 1.5E-5.

In the examples of FIG. 5 and FIG. 6 the edge-DDM is seen to be accurate compared with the simulation of the exact mask structure. Although the vertical mask topography (180°≈170 nm≈1$\lambda$) is comparable to the wavelength, the fact that the lateral dimensions of the space and the line are relatively large compared with the wavelength (CD=400 nm>2×193 nm=2×$\lambda$) renders the edge-DDM accurate. One expects that as the lateral sizes become smaller and the vertical mask topography even larger the edge-DDM will eventually break down. The limits of the edge-DDM were investigated through exhaustive simulation of isolated spaces and lines on the mask with various etched depths and amounts of undercut. The sidewall angles were always kept vertical and no rounding at the bottom of the etched wells was included. The mask CD was varied in the set {2 μm, 1 μm, 0.6 μm, 0.4 μm, 0.2 μm(~1$\lambda$), 0.1 μm}, the etched depth in {0°, 90°, 180°, 270°, 360°} and the amount of underetch in {0 nm, 25 nm, 50 nm, 75 nm, 100 nm}. All 2 (space/line) by 2 (TE/TM illumination) by 6 (CD sizes) by 5 (etched depths) by 5 (underetch)=600 cases were run and the rigorous (r-mask) scattered field was automatically compared with that obtained from edge-DDM. The results of the investigation were spectacular. The edge-DDM can readily achieve better than 1% accuracy (in a NMSE sense) in the near field for CD=400 nm (4×) or larger regardless of depth, underetch and polarization. The accuracy in the TTL-spectrum is sufficient in those cases even for inspection (R=1) simulations. For lines, the edge-DDM maintains excellent accuracy in the TTL-spectrum with R=4 down to a mask CD of 100 nm (~0.5$\lambda$) with 90° of etched depth and 0 nm of undercut, or mask CD of 200 nm (~1$\lambda$) with 270° of etched depth and 25 nm of undercut. For spaces, the accuracy of the method is acceptable at least down to mask CD of 200 nm (~1$\lambda$) with 270° of etched depth and 50 nm of underetch.

Current state-of-the-art photomasks and processes utilize sub-resolution assist features that are never less than one wavelength in size on the mask. This clearly implies that the edge-DDM has the potential to accurately simulate the most advanced photomask technologies (OPC, alt. PSM, OPC on alt. PSM). Again, the true power of the method lies on its application in 2D mask layouts. However, one key difference with the DDM of mask openings is the following: only one rigorous 2D simulation of an edge suffices for the scattered field reconstruction of any arbitrary size opening on the mask. The DDM of openings requires a separate simulation of every different mask size. Next, the application of the edge-DDM in 2D layouts is developed.

Figure 7:
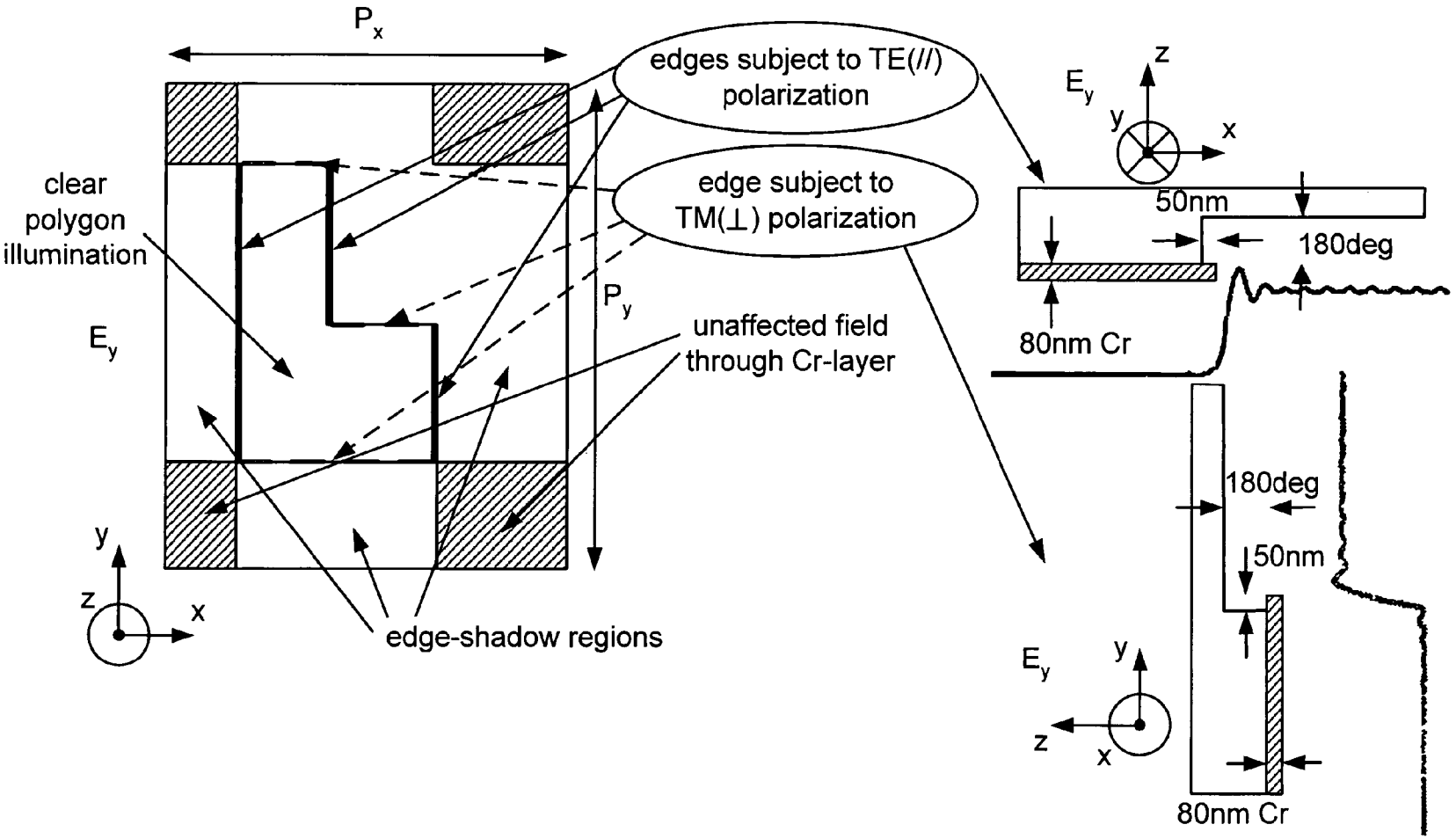
FIG. 7 illustrates an edge domain decomposition method applied on an arbitrary polygon.

The application of the edge-DDM in 2D layouts is straightforward. A mask layout comprises of a large number of edges positioned at different locations and having different orientations. No matter how complicated the mask technology, there are usually only a small number of different types of edges present in the layout. For example, a single exposure 0°/90°/270° alt. PSM has five types of edges: i) Cr-layer/0° edge, ii) Cr-layer/90° edge, iii) Cr-layer/270° edge, iv) 0°/90° edge and 0°/270° edge. Depending on the orientation of each edge in the layout it "sees" and responds to the incident field differently. If the illuminating field is a TE ($E_y$) normally incident plane wave and the edge is oriented along the y-axis it "sees" TE illumination, but if it is oriented along the x-axis it "sees" TM illumination. This is illustrated in FIG. 7. Depending upon the orientation of each edge in the layout it "sees" and responds to the incident field differently. Here the illuminating field is a TE ($E_y$) normally incident plane wave and the edges that are oriented along the y-axis "see" TE illumination (parallel to the edge), whereas the edges that are oriented along the x-axis "see" TM illumination (perpendicular to the edge). A separate 2D edge simulation is required to capture the different response of the edge to different field polarizations. The response of each edge to its respective illumination is taken into account rigorously from a pre-stored 2D edge-diffraction simulation. However, corner effects are effectively ignored, since the finite extent of each edge is not rigorously taken into account. Instead, the scattered field at the end points of every edge is abruptly terminated (truncated) in a perfect square-wave fashion to the field value of the kmask model. Comer effects in typical imaging situations are mapped at the extremities of the spectra and do not contribute to the image formation. Owing to this observation, the edge-DDM applied in 2D layouts is successful in accurately capturing the true electromagnetic behavior of edges in a rapid manner, while the insignificant comer effects are safely ignored.

Slightly different embodiments of the edge-DDM applied in 2D layouts can be devised. One that is powerful and general in its application is described next. Then, scattering results from various edge profiles that would be encountered in alt. PSMs are presented for completeness. Next, application of the edge-DDM in simple 2D mask layouts is presented and the results of the method are compared with fully rigorous r-mask models in order to establish the validity of this approach. Finally, a large portion of a real layout from a single exposure 0°/90°/270° alt. PSM that is too big for 3D rigorous simulation is simulated via the edge-DDM and the aerial image is compared with the simple k-mask model.

First, every distinct edge that is present on the layout is pre-simulated with all possible illumination directions (field polarizations) that are required, based on the orientations of the edge encountered within the layout. For simplicity only Manhattan-type layouts are considered, where the edges are oriented along either the x- or the y-axis and require electromagnetic simulation under both parallel and perpendicular to the edge polarizations. The extension to non-Manhattan layouts although much more computationally laborious is straightforward. Subsequently, each distinct mask layer is broken up into a set of mutually disjoint (non-overlapping) rectangles. For example, a plain binary mask consists of two layers, namely the absorption layer (typically Cr-based) and the clear (uncovered) layer, whereas a more advanced 0°/90°/270° three-phase alt. PSM consists of four layers, namely the absorption layer and the 0° clear, 90° clear and 270° clear layers. Next, looping through all rectangles of each layer, the type of each one of the four edges of the rectangle is determined based on what its neighboring layer is. Trivial edges (when the neighboring rectangle is of the same type) are discarded. It is also possible that only part of a single edge from a rectangle is neighboring with one layer and the rest is neighboring with a different layer (or different layers). In that case the edge is broken up in multiple edges, in a way that tracks the neighboring layer. What is left at the end of this process is a set of all non-trivial edges that are present in the layout (location, size and orientation) and their type, i.e. which are the two mask layers on each side of the edge. Given the mask layout, the k-mask (Kirchhoff-mask) model is readily available. Finally, the respective (complex) difference of the true edge-scattering from the ideal and sharp k-mask model is added to all non-trivial edges accordingly. This revised mask model that results from the edge-DDM includes accurate information about the electromagnetic scattering from the edges and it is a quasi-rigorous mask model (qr-mask) in the same sense that the term was used where only 2D mask simulations were used to approximate a 3D electromagnetic problem.

The above algorithm was implemented in a MATLAB environment. The part that deals with the polygon and edge extraction can probably be judged as rudimentary and most likely cannot compete in speed with more sophisticated implementations in production caliber CAD software, but it suffices for the purposes of this work, that is, to demonstrate the proof of concept of the edge-DDM and the feasibility of including accurate edgescattering information in rapid aerial image simulations.

Examining the departure of the scattered field from an edge from its ideal, sharp edge-transition and how it depends on the profile of the edge and the incident field polarization can provide intuition of the physical mechanisms involved.

FIG. 8 shows the amplitude of the (near) scattered field from an edge with various profiles. The ideal, sharp edge-transition is also shown on every graph for comparison. In FIG. 8(a) and (b) the edge-scattering for different etched depths (0°, 180° and 360°) and vertical sidewalls with no undercut is shown for TE ($E_y$) and TM ($E_x$) illumination respectively. The effect of undercut is depicted in FIG. 8(c) and (d), where the edgescattering for different amounts of undercut (0 nm, 25 nm, 50 nm and 75 nm) and vertical sidewalls with 180° etched depth is shown for TE and TM illumination respectively. It is interesting to note that increasing the etched depth is "making the edge response slower", meaning that the near scattered field from the edge requires more distance to reach its "on" value from its "off" value, although this effect is more pronounced for the first increment from 0° to 180° rather than from 180° to 360°. Similarly, increasing the amount of undercut appears to "make the edge response faster" and furthermore this behavior appears to be linear, since for every increment of the undercut the edge-transition gains a constant distance in its "off-on" behavior.

Figure 9A:
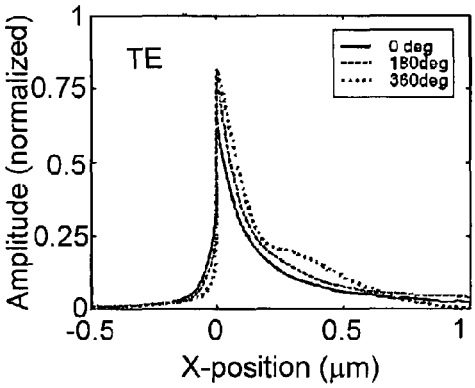
FIGS. 9(a)-9(d) illustrate complex differences of true edge-scattering from ideal and sharp transition.
Figure 9B:
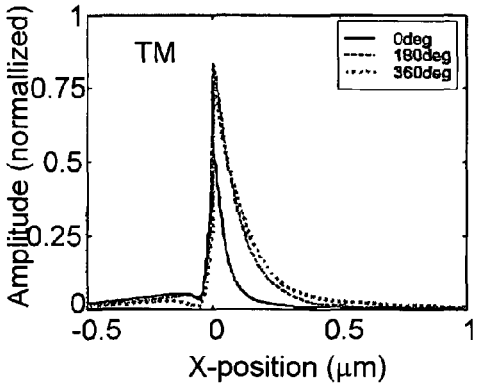
Figure 9C:
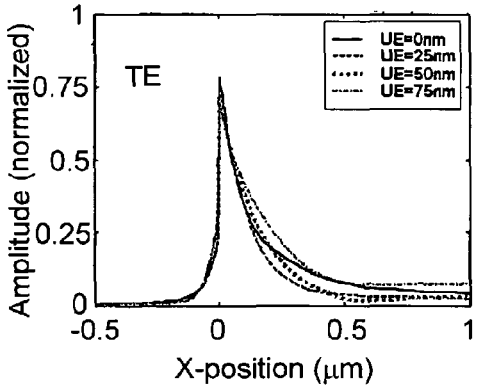
Figure 9D:
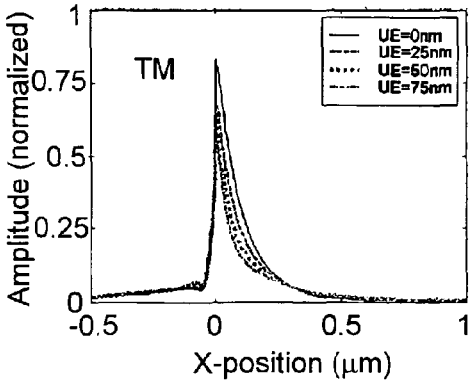

It is instructive to isolate the difference of the true edge-scattering from the ideal, sharp edge-transition. This is done in FIG. 9, which depicts the amplitude of this (complex) difference for all respective plots of FIG. 8. Here the amplitude of the complex difference of the true electromagnetic field scattered from an edge from the ideal, sharp transition (step-function) is shown in FIGS. 9(a)-(d) for all edge profiles and illumination polarizations of FIG. 8 respectively. FIGS. 9(a) and (c) are for TE polarization and FIGS. 9(b) and (d) are for TM polarization. The spatial extent of the difference grows with increasing etched depths, as seen in FIGS. 9(a) and (b), and shrinks with increasing undercuts, as seen in FIG. 9(d) for TM polarization. The behavior in FIG. 9(c) appears somewhat erratic, but if the phase is also taken into account, it is shown in FIG. 10 that this is also the case for TE polarization. Observe that, indeed, by increasing the etched depth the difference has a larger spatial extent, whereas increasing the amount of undercut confines the spatial extent of the difference. This is crucial, because it is exactly the spatial extent of the difference that affects its spectral distribution. If the difference is well confined, its spectral distribution is spread out to higher spatial frequencies and the lower frequency content is small. In such a case the complex difference can be neglected and the approximation of the ideal, sharp transition is adequate.

Figure 10A:
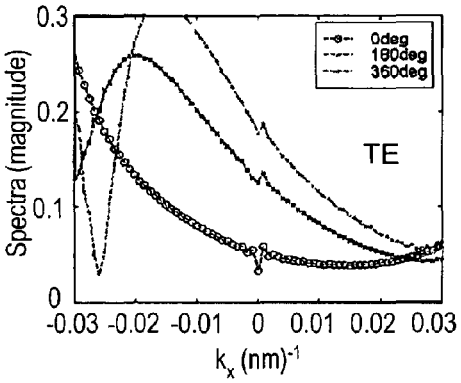
FIGS. 10(a)-10(d) illustrate the spectra of complex differences shown in FIGS. 9A-9D.
Figure 10B:
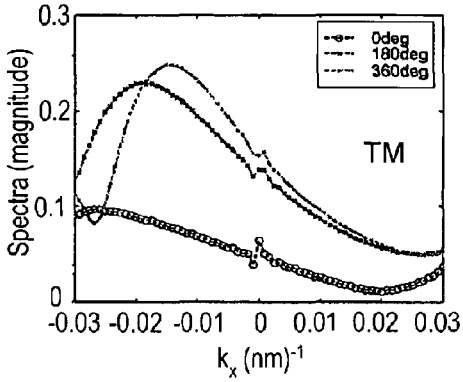
Figure 10C:
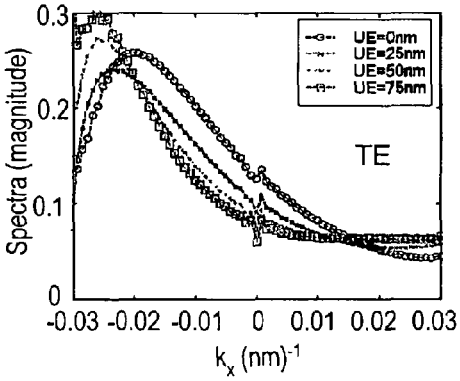
Figure 10D:
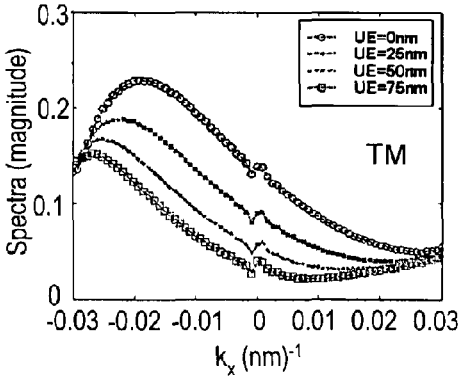

However, when the difference has a larger spatial extent, then its lower frequency content becomes significant and it cannot be neglected. This is shown in FIG. 10, which depicts the magnitude of the spectra of all respective difference distributions of FIG. 9. Here the spectra of the complex differences shown in FIG. 9 are depicted here respectively. FIGS. 10(a) and (c) are for TE polarization and FIGS. 10(b) and (d) are for TM polarization. Observe that the through-the-lens (TTL) parts of these spectra, which for typical lithographic imaging situations (R−4, NA~0.7-0.8) extent up to ~±0.008 $(\text{nm})^{-1}$ are smaller for smaller etched depths and larger undercuts, regardless of polarization, as expected from the observations on the plots of FIG. 8 and FIG. 9. Observe that the TTL spectrum of the difference attains larger values when the etched depth increases and smaller values when the amount of undercut increases, as expected from FIG. 8 and FIG. 9. Remember that the normalization used in spectra plots is that a constant (DC) value of 1 (clear field) would produce a Dirac δ-function at zero frequency with amplitude of 19.4 ($\sqrt{\eta}=\sqrt{\sqrt{\mu_0/\epsilon_0}}\approx 19.4\ \Omega$).

The application of the edge-DDM on an isolated square hole and an isolated square island (post) and comparison of the results with fully rigorous 3D mask simulations (rmasks) are presented here. The edge profile has a glass etched depth of 180° and an undercut of 50 nm. The dimensions of both the hole and the island are 400 nm×400 nm (4×), corresponding to approximately 2×2 wavelengths, for λ=193 nm.

Figure 12A:
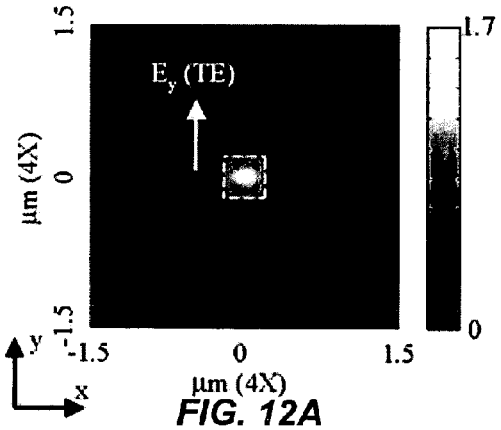
FIGS. 12(a)-12(c) illustrate edge domain decomposition applied on an isolated square hole (scattered field).
Figure 12B:
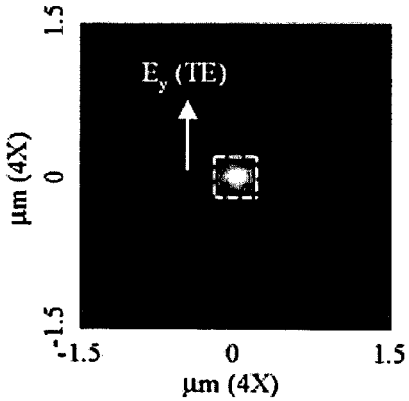
Figure 12C:
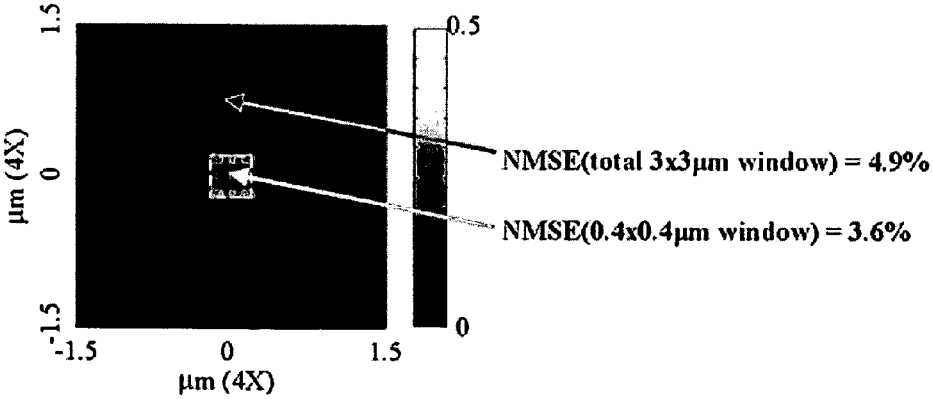
Figure 13A:
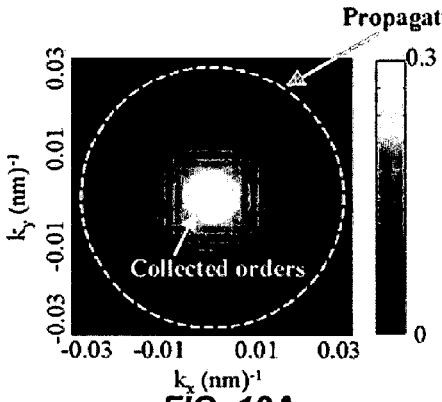
FIGS. 13(a)-13(c) illustrate edge domain decomposition applied on an isolated square hole (spectrum).
Figure 13B:
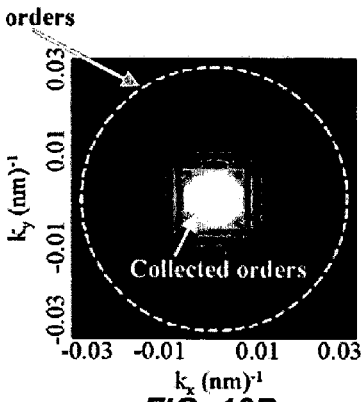
Figure 13C:
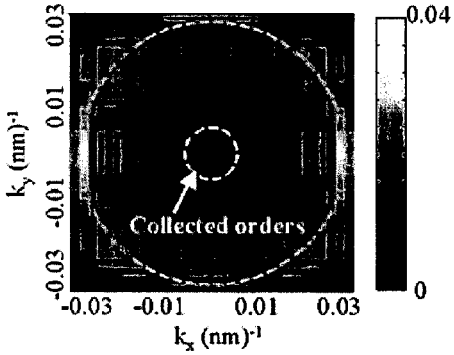

FIG. 12(a) and (b) depict the amplitude of the scattered field across the observation plane below the hole obtained via the edge-DDM and via fully rigorous 3D simulation, respectively. The amplitude of their difference (error of the edge-DDM) is shown in FIG. 12(c). Locally the amplitude of the error is seen to reach a discouraging level of almost 50% of the clear field value. The normalized mean square error is however more contained and is only about 4.9% if calculated within a 3 μm by 3 μm area or 3.6% if calculated within the 0.4 μm by 0.4 μm open area of the hole, as shown in FIG. 12. From the work presented so far, it should be obvious that neither of these error levels is immediately relevant in the simulation of the image formation. What is rather more relevant is the error incurred on the diffraction orders that are collected by the imaging optics. If the spatial frequencies of the error depicted in FIG. 12(c) are sufficiently high, this error will be discarded by the projection lens. This concept is shown in FIG. 13, where the spectra (magnitude) of the scattered fields from edge-DDM and from rigorous 3D simulation are shown in FIG. 13(a) and (b) respectively. The marginal circles indicating the propagating plane waves (with $|\vec{k}|\leq 2\pi/\lambda$) and the collected by the imaging system plane waves (with $|\vec{k}|\leq 2\pi NA(1+\sigma)/\lambda R$), for NA=0.75, R=4 and σ=0.3, are indicated on these plots. The magnitude of the error in the spectrum of the field obtained from edge-DDM is shown in FIG. 13. Observe that most of the error is concentrated in the higher spatial frequencies for $|k_x|$ approaching 0.03 and only small levels of error exist in the collected orders. The normalized mean square errors of all propagated and collected orders are 2.2% and 2E-4 respectively.

Figure 14A:
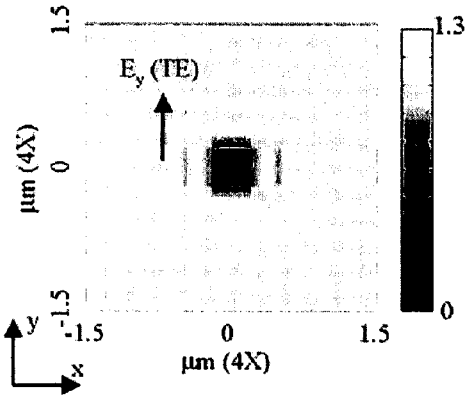
FIGS. 14(a)-14(c) illustrate edge domain decomposition applied on an isolated square island (scattered field).
Figure 14B:
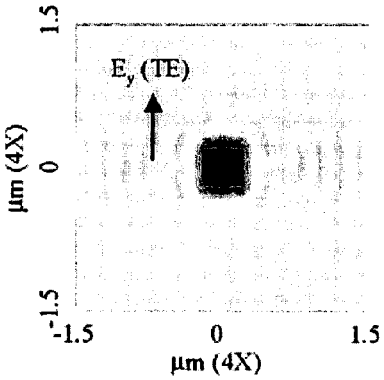
Figure 14C:
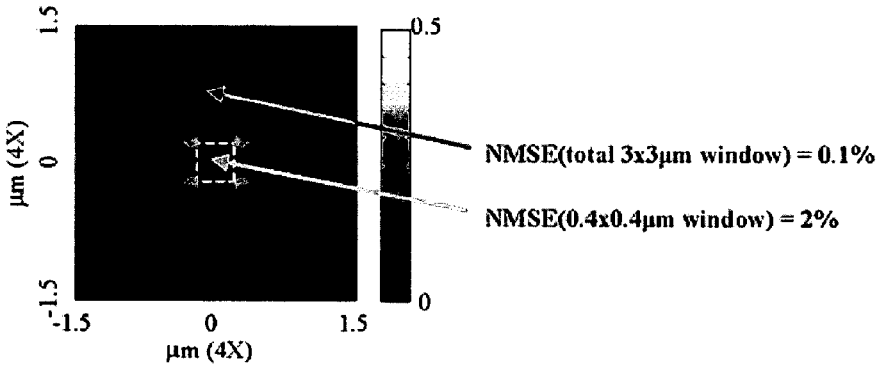

Similarly, the amplitude of the scattered fields across the observation plane below the isolated island obtained with the edge-DDM and with fully rigorous 3D simulation and the amplitude of the error are shown in FIG. 14. Again, a locally significant error amplitude near the comers is evident. However, the energy of this error is concentrated mostly at the higher spatial frequencies, for $|k_x|$ approaching 0.03 and the error in the collected orders is seen to be small, only 0.16% in a NMSE sense. Note that the large DC component of the isolated island mask layout was subtracted in order to make meaningful comparisons of the edge-DDM with fully rigorous simulations. Otherwise this large DC component would artificially show an even better accuracy, since the error level in comparison with a much stronger signal (containing the DC term) would be smaller.

Each fully rigorous mask simulation of the patterns of FIG. 12 and FIG. 14 that was performed with TEMPEST used approximately 1.8 Gbytes of memory and required almost 2 days on a 550 Mhz CPU. On the other hand, once all of the required 2D edge simulation results are available the scattered field can be obtained with the edge-DDM in less than 1 sec. The simulation of the isolated edge-diffractions is an off-line procedure. It only needs to be performed once and the edge-diffraction results are recycled as many times as are necessary for the reconstruction of the scattered fields of arbitrary layouts. In the above examples, it took approximately 5 min for each rigorous, isolated-edge 2D simulation.

Figure 11:
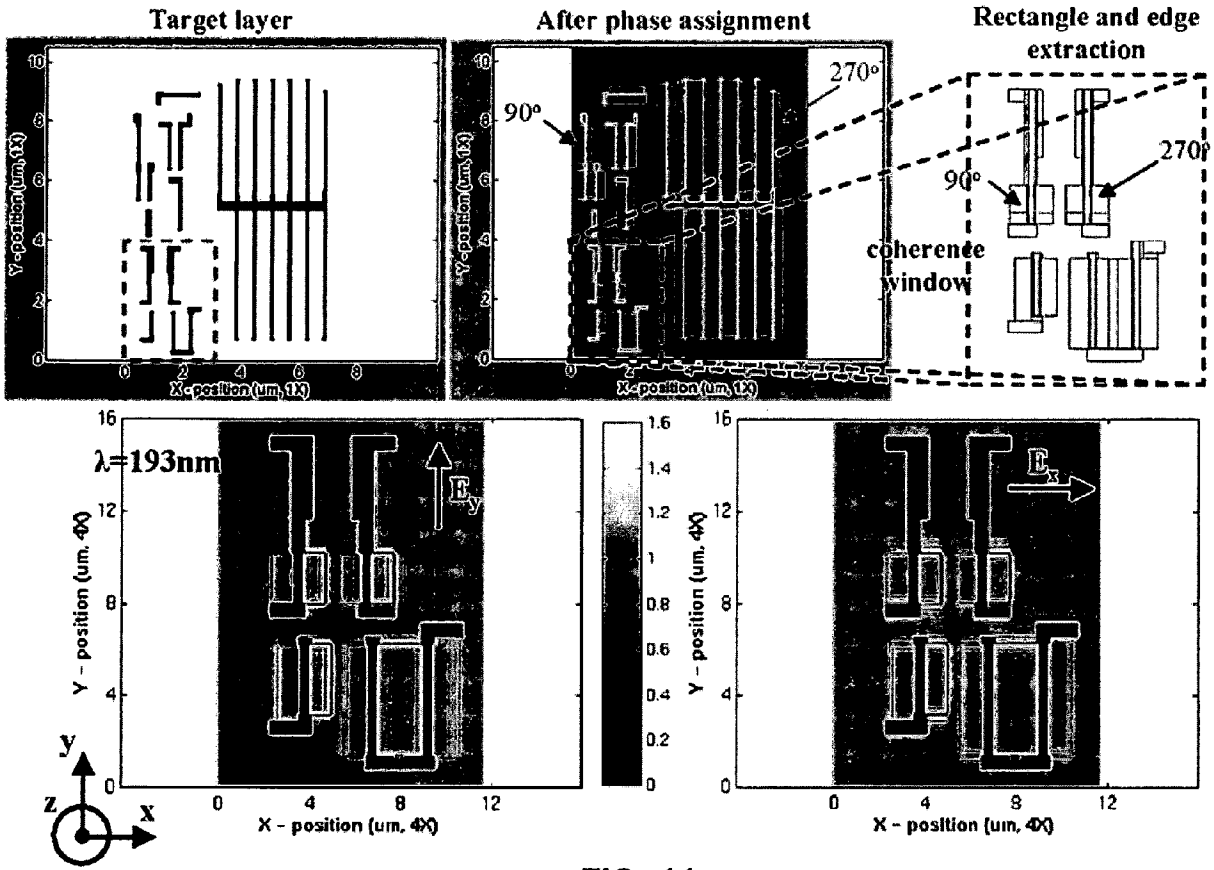
FIG. 11 illustrates edge domain decomposition on a large mask layout.
Figure 16:
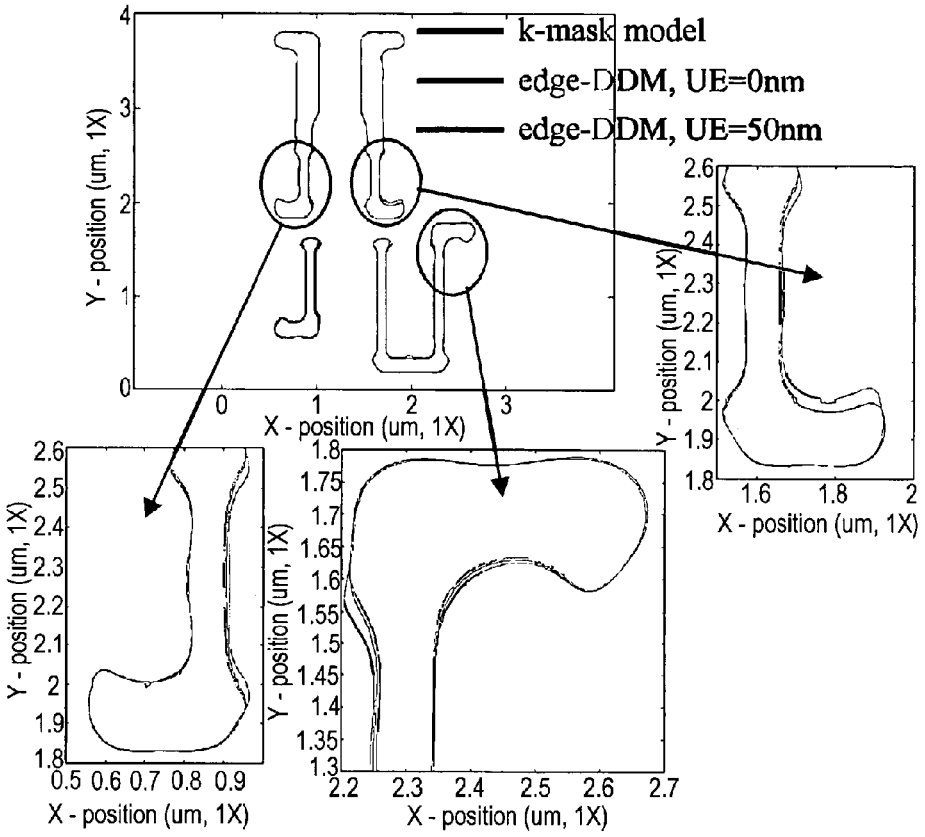
FIG. 16 illustrates edge domain decomposition on a large mask layout (images).

The edge-DDM is used here to generate the scattered field from a three level (0°/90°/270°) alt. PSM. A portion of the arbitrary target layout is shown in FIG. 11 before and after the phase assignment. Rectangle and edge extraction is performed within the 3 μm by 4 μm (1×) coherence window shown and the scattered field obtained with the edge-DDM inside the 12 μm by 16 μm (4×) coherence window is also shown in FIG. 11 for TE and TM illuminations at λ=193 nm. Note that a fully rigorous 3D mask simulation of a 12 μm by 16 μm (4×) layout would require close to 40 Gbytes of memory and would only be feasible on a multi-CPU architecture. The scattered field is obtained with the edge-DDM implementation in less than 1 min. This time includes the polygon and edge extraction and the field synthesis from pre-calculated edge-diffractions. Therefore, the results of the edge-DDM cannot be immediately compared with a fully rigorous solution, but the accuracy of the edge-DDM within the imaging system's collection ability can reveal the inaccuracies of the ideal k-mask, where all transitions are assumed perfectly sharp. This is done in FIG. 16, where the images (at the 30% intensity level) obtained with the k-mask and the edge-DDM for two different undercuts (0 nm and 50 nm) are compared. The system parameters are λ=193 nm, NA=0.7, σ=0.3 and R=4. The inaccuracies of the k-mask model are revealed at various locations in the image as seen in FIG. 16.

The effect on the image of changing the undercut from 0 nm to 50 nm can be quickly and accurately evaluated. Observe the subtle differences evident in the intensity contours of the 0 nm and 50 nm masks of FIG. 16.

Figure 17A:
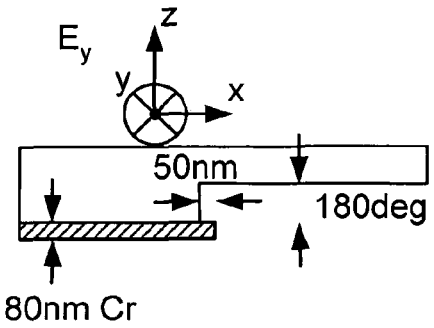
FIGS. 17(a), 17(b) illustrate matched bandwidth approximation to edge diffraction.
Figure 17A:
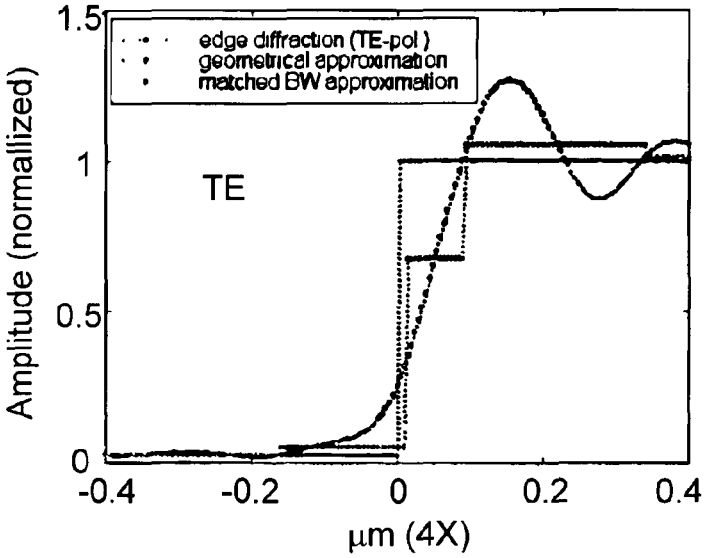
Figure 17B:
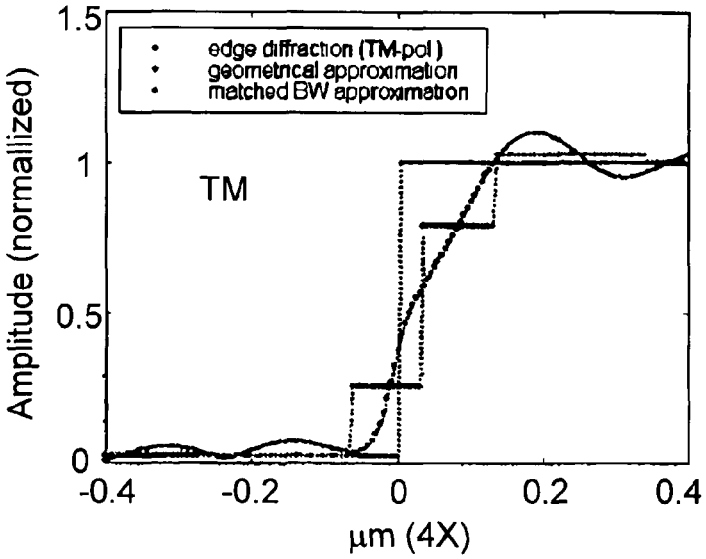

Although the edge-DDM presented earlier achieves excellent accuracy and tremendous speed-ups as compared to a fully rigorous mask simulation, there is still one more parameter to exploit in order to further speed-up the method. There is no need to carry all the details of the true field scattering as far as the imaging process is concerned (with larger than 1 reduction factors), since the higher spatial frequencies are not used. If a lumped parameter model can be devised that closely matches the TTL spectrum of the scattered field then the task of an accurate field representation is accomplished. A rect-function, a raised cosine function and a Gaussian function can successfully mimic the TTL spectra of scattered fields from various size and profile openings. A similar principle can be applied here with the purpose of matching the TTL spectra of edgediffracted fields. Assuming a restriction to piecewise constant models, the scattered field from an isolated edge under TE or TM illumination can be approximated using the multistep functions shown in FIG. 17. Although not shown in FIG. 17, the amplitude, phase and size of all steps are optimized to achieve the best spectral matching of the collected (TTL) orders with the orders resulting from the continuous edge-diffracted field. Note that the key factor for a good spectral match is to capture the finite extent of the "off-on" edge-transition. A piecewise constant function is probably not the best choice to achieve this task, but on the other hand a piecewise constant function offers a good lumped parameter approach and it lends itself nicely as an extension of the unmatched Kirchhoff approach, where all edge-transitions are assumed perfectly sharp. Instead of approximating the true edge-diffraction by a single step function (geometrical or Kirchhoff approximation) a multi-step piecewise constant function is employed. The amplitudes, phases and sizes of all steps are optimized to achieve the best spectral matching of the collected orders with the orders resulting from the continuous edge-diffracted field. The matched bandwidth approximations to the field diffracted by a 180° edge with 50 nm undercut under TE and TM illuminations are shown in (a) and (b) respectively.

Figure 18A:
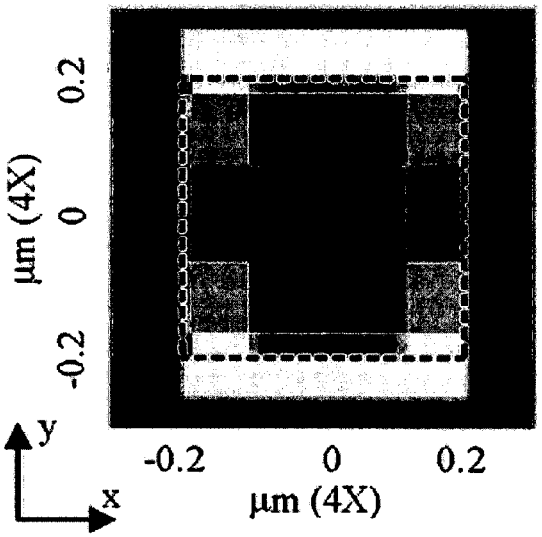
FIGS. 18(a), 18(b) illustrate matched bandwidth approximation applied to the hole of FIG. 12.
Figure 18B:
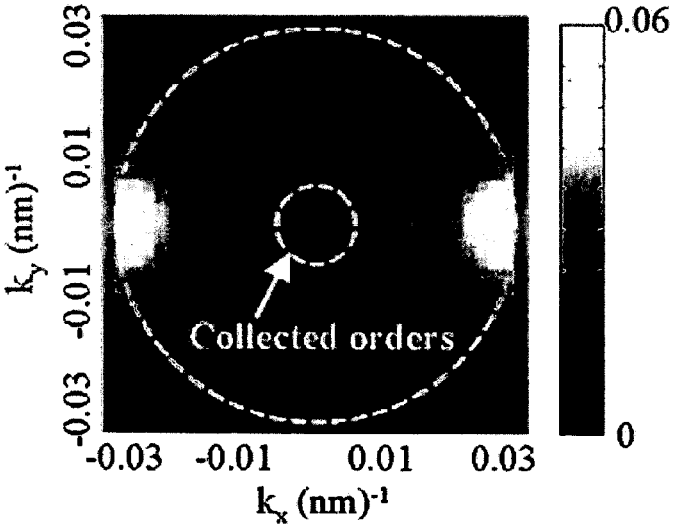

If the matched bandwidth edge-DDM is applied on the 400 nm by 400 nm (4×) isolated hole of FIG. 12 the scattered field across the observation plane can be represented in the compact way shown in FIG. 18(a). Recall that the edges parallel to the y-axis "see" TE polarization and the edges parallel to the x-axis TM polarization. The multi-step matched BW approximations to the edge-diffraction shown in FIG. 17 for TE and TM illuminations intermingle in the x- and y-directions to produce the multi-color mask of FIG. 18(a), where each color represents a different amplitude and phase region of the mask. The spectrum of the error of this approach is depicted in FIG. 18(b). Note that compared to the error shown in FIG. 13(c) this error has increased by almost four-fold. Nevertheless, the error in the TTL spectrum still remains at low enough levels for accurate imaging simulations. A better approximating function, other than the piecewise constant step function, that is more capable of capturing the true edge-diffraction profile (such as linear or higher order polynomial) should result in better spectral matching and consequently more accurate imaging simulations.

Consider now a domain decomposition strategy appropriate for handling wavelength size phase defects. The bright future for alt. PSMs as a major resolution enhancement technique (RET) has been plagued primarily by the difficulty to reliably inspect them, flag locations that phase defects are present and subsequently repair the defective locations. State-of-the-art inspection systems utilize a focused laser beam that can be either at-wavelength (up to $\lambda$=248 nm), meaning that the wavelength of the inspection beam is the same as the wavelength that the alt. PSM was designed for, or emit light of a larger wavelength. This beam scans the entire mask and the reflected or transmitted scattered fields from the particular mask location under inspection are imaged with a very high resolution imaging system that typically has a reduction factor of R=1 and NA close to 1. But here is the caveat: After the signal from the inspection tool for a particular mask location is available it needs to be compared to something in order to determine whether or not a phase-defect (or other defect) is present within that location. Such a comparison is in general very difficult, because not only does it need to be accurate in order to reliably flag defective locations, but it also needs to be rapid enough for the entire reticle to be inspected in a reasonable amount of time.

The most promising direction that has been adopted by researchers working on the problem has been what is known as a die-to-database comparison. By that, it is meant that the local signal is compared to the signal that the same mask location would produce if it were defect-free. The problem now shifts to building the database of signals from defect-free masks. Note that all possible mask geometries that will be encountered in every inspected reticle need to exist in the database. One way to building the database would be to produce a (set of) test reticle(s) that includes every single geometry situation that is anticipated to exist in all designed layouts to come. This (set of) test reticle(s) is then meticulously inspected with a reliable tool (maybe an atomic force microscope—AFM) to guarantee that it is defect-free and finally all signals from the different locations are collected and placed in the vault (database). Clearly, the immensity of this task has to do not only with the a priori precise anticipation of what layout situations to take provision for, not only with manufacturing the test reticle(s), characterizing it and building the database, but also with the sheer volume of data that such a database would contain. Moreover, a precise diagnosis of the type, size and location of a phase defect requires an even larger database of benchmark signals, where every possible combination of defect type, size and location in every possible layout configuration needs to exist in the database. Performing such a task in a way similar to the one outlined is impractical.

Simulation can again come to the rescue, at least in principle. If a simulation tool that can rapidly and accurately predict the expected signal resulting from a defect-free or defective location on the mask is available, then the task of building the database is simplified tremendously. Moreover, if such a tool is really fast (and accurate) then a database is not even needed. The required benchmark signal from the defect-free layout is generated in-situ, while the inspection system gathers measurements. The problem with this solution is that to date there exists no simulation tool that possesses both the rapidity and accuracy properties. The family of simulation tools that rigorously solve Maxwell's equations around the reticle (such as TEMPEST) and subsequently use a vectorial formulation for the image formation to calculate the expected optical signal from the inspection system are impractical because of large memory and time requirements. On the other hand the accuracy of speedier simulation programs that circumvent the solution of Maxwell's equations around the mask is unacceptable.

Yet another important consideration of an inspection system for alt. PSMs should be the following: Phase-defects that are not critically affecting the image that a projection printing tool will produce on the wafer surface should be discarded, i.e. not flagged and not repaired. But this is also a difficult task, since the only bullet-proof way of achieving this would be to expose wafers with the suspect defect present and examine if the printed resist images have intolerable artifacts. Clearly, such a process now involves the close cooperation of the inspection system with the projection printing tool. However, an accurate and properly calibrated simulation tool can alternatively assess the tendency of the defect to print or cause other image artifacts. Consequently, the costly step of exposing wafers can be avoided and a decision of repairing or not the defect rests fully upon the simulation result. Again, to date, results from no simulation tool, that is fast enough in calculating expected images with phase defects present, can be trusted to base repair decisions on.

The domain decomposition methods described above are appropriate for solving the problem of the rapid and accurate evaluation of the benchmark signal from nondefective masks for the inspection system. A domain decomposition method is presented that addresses the problem of the defect printability assessment, after a defect is previously found. The generation of benchmark signals from defective mask locations can also be based on the domain decomposition technique, although more work will be needed to adapt it and test it for the high-NA inspection optics with R=1. As will soon be obvious, the speed and efficiency of the method are inherited by virtue of the domain decomposition methods presented above, although for simplicity edge-DDM is not explicitly employed in the following. In the simulation examples, the illumination wavelength is 193 nm and the phase-wells are designed accordingly, so as to provide the required phase shifts for that wavelength.

Figure 19A:
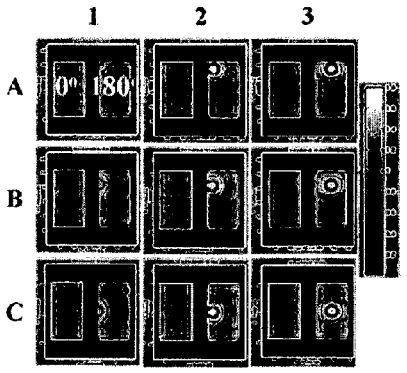
FIGS. 19(a), 19(b) illustrate defect assessment using prior art techniques.
Figure 19B:
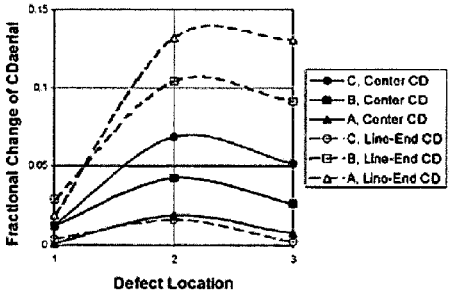

Consider the example depicted in FIG. 19. In FIG. 19(a) the near scattered field below a small layout of a 0°/180° alt. PSM is shown when a square 120 nm×120 nm (4×), 180° post phase defect is present at various locations within the layout. Note that although neither the layout nor the phase defect geometry change, a different simulation altogether is needed because of the different relative positions of the defect within the layout. Each one of the nine 3D simulations in the matrix shown in FIG. 19(a) takes approximately 10 hrs on a 450 MHz CPU and utilize 300 Mb of memory. Subsequently, the aerial images for all nine situations are calculated for an imaging system with R=4, NA=0.75 and σ=0.3. Then, the fractional change of $CD_{aerial}$ at the middle and at the end of the line because of the defect is found for all nine defect locations and is shown in FIG. 19(b). From the plot in FIG. 19(b) it can be deduced that when the defect is located in the middle of the phase wells or is mostly "tucked" underneath the absorbing layer (columns 3 and 1 of FIG. 19(a) respectively) the $CD_{aerial}$ is not critically affected, but locations such as those in column 2 of FIG. 19(a) cause larger $CD_{aerial}$ variations. In the former cases the defects could probably be discarded whereas in the latter repair seems necessary. Clearly, the luxury of the 10 hr-long simulations is only available as a proof of concept and such an approach is not viable for full-chip characterizations.

Figure 20:
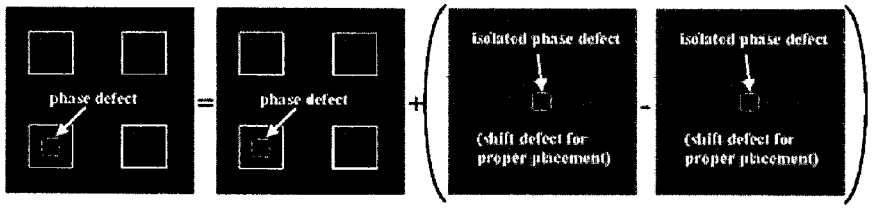
FIG. 20 illustrates domain decomposition in accordance with an embodiment of the invention when a defect is present.

Now, consider the paradigm shown in FIG. 20. A domain decomposition method is again invoked, where instead of a one-step simulation of the defective layout two separate rigorous simulations are performed, one with just the defect-free layout and one with just the defect in clear surroundings. The scattered field below the defect is then shifted accordingly, such that the defect is effectively placed at the location it appears in the defective mask, and the uniform background light is subtracted, so as to retrieve the (complex) signal of the local perturbation that the defect causes. This perturbation is added to the defect-free layout signal for an approximation to the signal from the rigorous simulation of the defective mask. The non-defective mask simulation can be performed rapidly using the edge-DDM decomposition methods described above.

A strategy can now be devised, where a database of the near electromagnetic field scattered from isolated phasedefects in clear surroundings is created for all possible potential defects that are critical. The volume of such a database can be reduced based on the earlier observations that defects with similar footprints (lateral dimensions) and small shape perturbations are equivalent from an electromagnetic point-of-view.

Figure 21A:
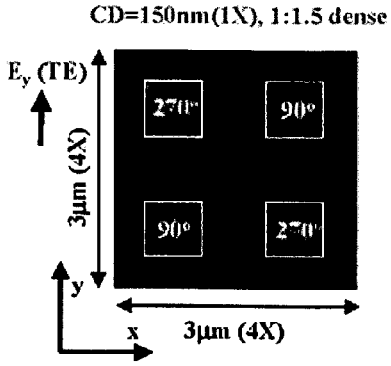
FIGS. 21(a), 21(b) illustrate layout and amplitude of scattered field below the mask at the observation plane.
Figure 21B:
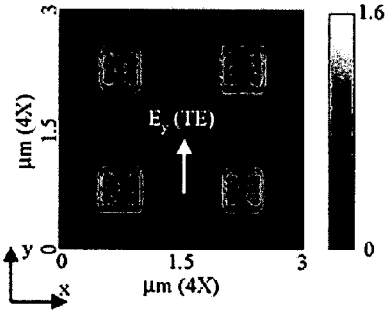

The suggested decomposition method will be introduced through the following example: Suppose a 150 nm (1×), 1:1.5 semi-dense, 90°/270° alt. PSM contact mask. The layout and the scattered field across the observation plane under normal incidence Ey (TE) polarization are shown in FIG. 21.

Figure 22A:
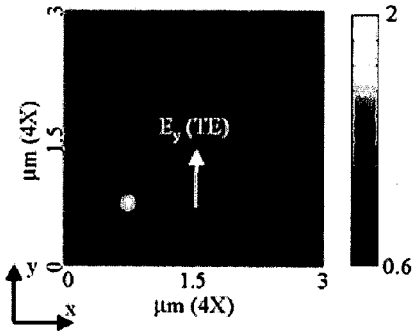
FIGS. 22(a)-22(d) illustrate a 90 degree phase defect present in the center of the bottom-left hole of a mask.
Figure 22B:
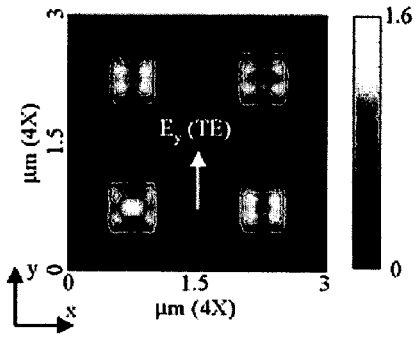
Figure 22C:
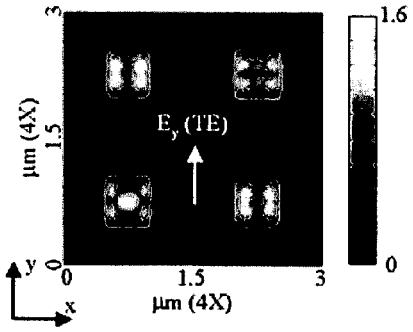

Now, suppose that a 200 nm by 200 nm (4×) 90° post defect is present in the center of the bottom left hole. According to the paradigm of FIG. 20, the mask scattering simulation can be broken up into two constituent parts. This approach is shown in FIG. 22. In FIG. 22(a) the phase defect is simulated in an isolated configuration at the location that it appears in the layout. In FIG. 22(b) and (c) the near field across the observation plane below the defective alt. PSM is shown, using the domain decomposition method and the complete mask respectively. The differences are not discernible from the plots of FIGS. 22(b) and (c) and one has to look at the amplitude of the error in FIG. 22(d). Again, not only is the error level of the decomposition low, but the frequency content is very high, so that it will be filtered out by the imaging system.

Next, suppose that the same 90° post defect is present in the center of the bottom right hole. The important observation here is that no new simulation is necessary for the edge decomposition method. The scattering of the isolated phase defect can be recycled from the database, i.e., from FIG. 22(a). However, the scattered field is now properly shifted in the lateral x-direction and also (a key step) it is propagated in the z-direction. This results in the plot of FIG. 23(a), where a larger diffraction spreading is evident. In FIGS. 23(b) and (c) the near field across the observation plane below the defective alt. PSM is shown, using the domain decomposition method and the complete mask respectively. The amplitude of the error is shown in FIGS. 23(d) and similar observations apply in FIG. 22(d).

Figure 24A:
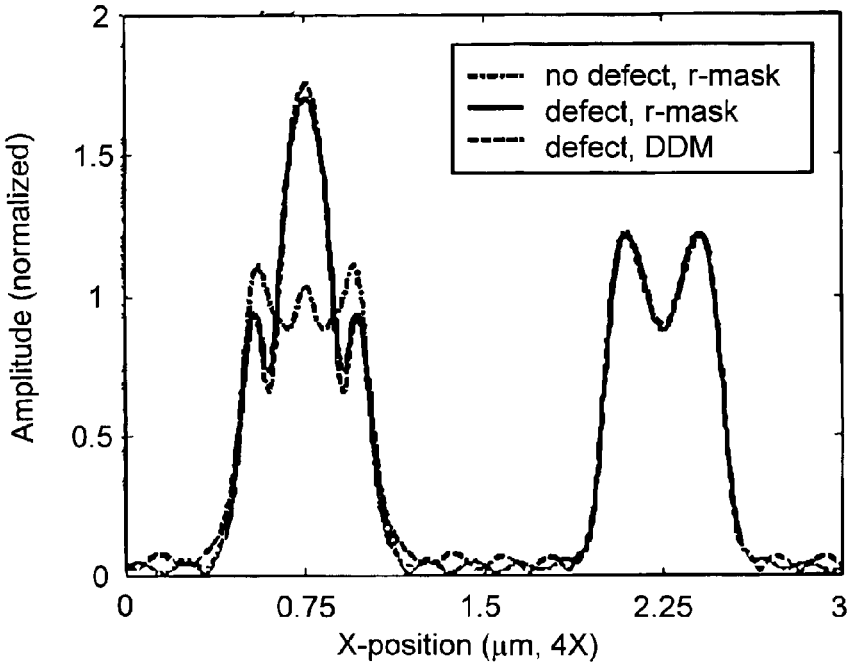
FIGS. 24(a)-24(b) are a comparison of the decomposition method with the rigorous determined scattering.
Figure 24B:
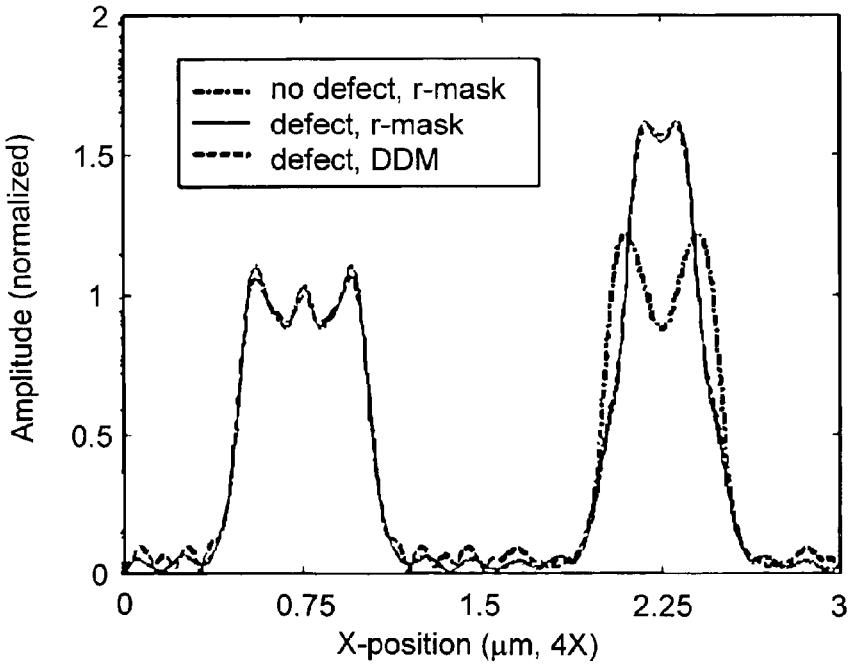

The near fields across cut-lines passing through the center of the bottom two holes (90°, 270°) are shown for the two defective masks in FIG. 24, comparing the rigorous (r-mask) and the decomposition methods (DDM). The non-defective case is also plotted for comparison.

Figure 25A:
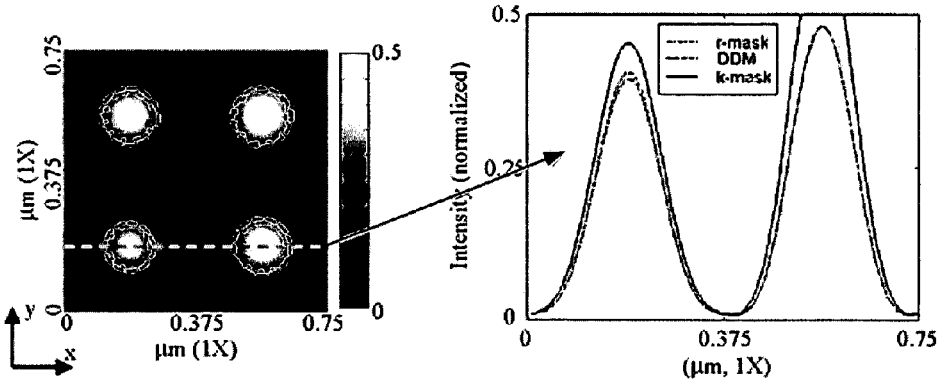
FIGS. 25(a)-25(b) are plan views of defective masks of FIGS. 22 and 23.
Figure 25B:
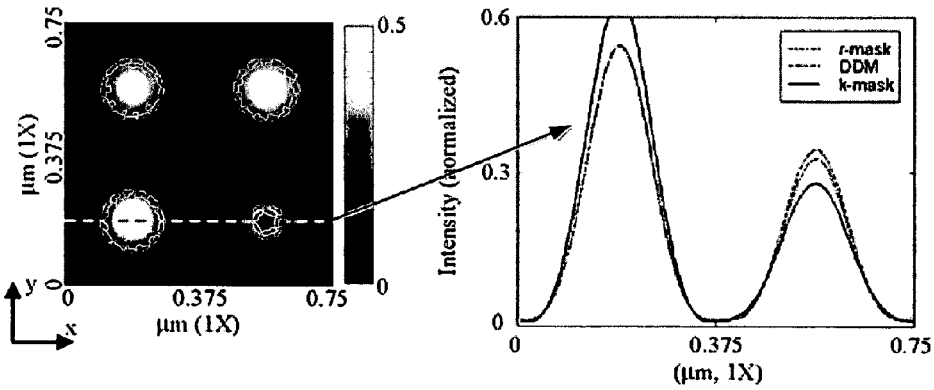

Next, the images of both rigorous and DDM approaches, for both defective masks are compared in FIG. 25, (a) for the 90° hole and (b) for the 270° hole. The optical system parameters are λ=193 nm, R=4, NA=0.75 and σ=0.3. The agreement between the r-mask and the DDM is good, a normalized mean square error of less than 0.3% is incurred (measured only in the area of the defective hole). The k-mask model is insufficient for capturing these effects and is only shown for comparison.

Figure 22D:
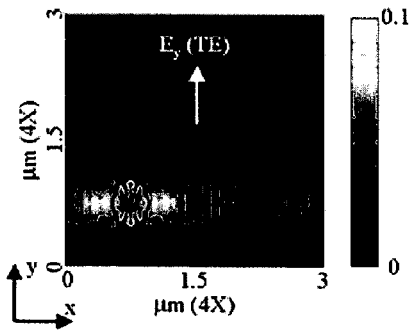
Figure 23A:
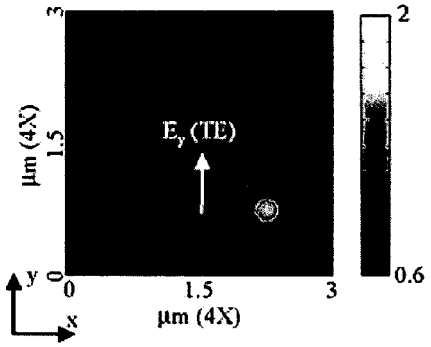
FIGS. 23(a)-23(d) illustrate a defect present in the center of the bottom-right hole of a mask.
Figure 23B:
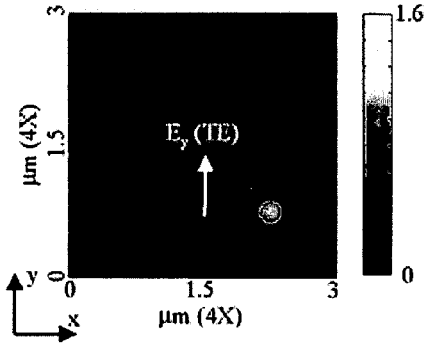
Figure 23C:
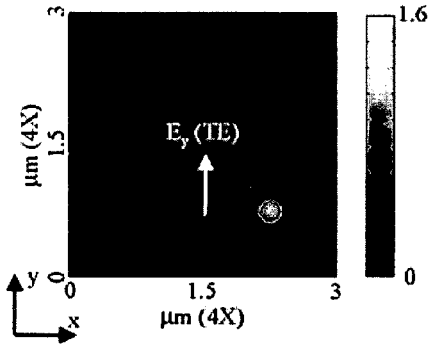
Figure 23D:
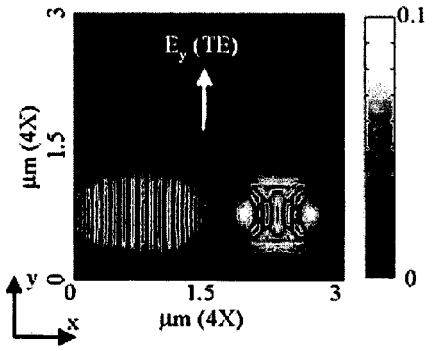
Figure 26A:
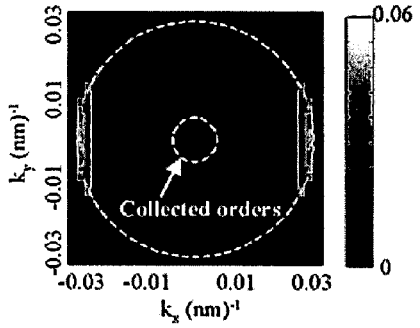
FIGS. 26(a)-26(b) are spectra plots (magnitude) of errors of FIGS. 22 and 23.
Figure 26B:
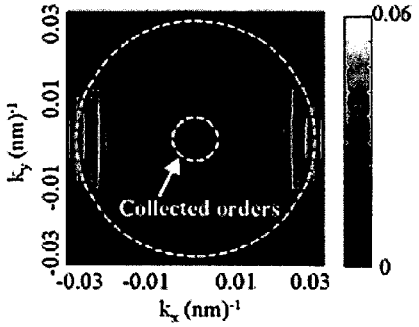

The reason of the excellent agreement in the predictions of the aerial image can be traced back to the plots of FIG. 22(d) and FIG. 23(d). The high spatial frequency variation of the error means that it is mapped at the extremities of the spectrum of propagating plane waves and is not collected by the optical system. The normalized spectra (magnitude) of the near field errors are shown in FIG. 26. Observe that the implied accuracy from these plots should be enough even for R=1 and NA~0.8-0.9, which would be sufficient for inspection simulations.

Thus the invention includes a suitable extension of the domain decomposition framework for the simulation of alternating phase shift mask with phase defects. The value of this approach is believed to be significant in the problem of rapid assessment of defect printability once a defect has been found, or in the die-to-database comparisons of inspection systems when deciding about the existence or not of a phase-defect.

The invention is an extension of known domain decomposition methods that introduces tremendous versatility, since only a small number of isolated edge-diffraction simulations is shown to contain all the necessary information for the synthesis of the scattered field from arbitrary 2D mask layouts and subsequent accurate imaging simulations. The limits of this method are reached when the mask features are smaller than a wavelength in size and the vertical mask topography is large. Through a systematic process it was determined that features as small as at least 200 nm bearing 270° of phase-wells can be accurately decomposed via the edge-DDM, at $\lambda$=193 nm. The method was tested for simple 2D layouts, where rigorous mask simulations are possible. Excellent accuracy accompanied by speed-up factors of 172,800 (1 sec vs. 2 days) have been demonstrated. The accuracy of the method is attributed to the fact that on one hand the edge-diffraction phenomena are modeled rigorously through 2D edge-diffraction simulations and that on the other hand the errors incurred during the synthesis (primarily near the corners) are mapped at the extremities of the spectrum of propagating plane waves and do not contribute to the image formation. It was emphasized that all necessary rigorous 2D simulations of the diffraction from isolated edge profiles is performed off-line and recycled for the diffraction calculation of arbitrary layouts. If needed, the accuracy of the edge profile diffraction simulations can be pushed to extreme limits, since it is performed only once. This can aid for example in the correct simulation of unusual edge profiles whose geometrical details would require excessive discretization of the domain. It was also shown that the exact details of the edge-diffraction are not necessary for accurate imaging simulations (with larger than 1 reduction factors) and a piecewise constant, multistep edge-transition model that matches the TTL spectrum was introduced. The range of validity of the edge-DDM is expected to be appropriate for rapid and accurate evaluation of aerial images whenever speed is critical, as for example in full-chip OPC software and die-to-database comparisons in the inspection of alt. PSMs.

While the invention has been described with reference to specific embodiments, the description is illustrative of the invention and is not to be construed as limiting the invention. Various modifications and applications may occur to those skilled in the art without departing from the true scope and spirit of the invention as defined by the appended claims.

What is claimed is:

1. A method [for simulation of light scattering in large three dimensional objects in a optical imaging system] comprising [the steps of]:

[a) decomposing a three dimensional object into a plurality of elementary two dimensional objects, b) defining the two dimensional objects by edges of the objects, c)] applying edge domain decomposition [for the edges of the] *to* two dimensional objects *corresponding to a three dimensional object* to identify light scattering by [the] *associated* one dimensional edges, and

[d)] summing scattered light from all edges to simulate light scattering in [two] *three* dimensions.

2. The method of claim 1 and further including: [e)] spectrally mapping the edge domain decomposition.

3. The method of claim 2 wherein the three dimensional object comprises a photo mask with multiple and interconnected openings.

4. The method of claim 3 wherein [step c)] *applying edge domain decomposition* includes computational methods which speed-up calculations through use of table look-up of previously calculated objects and filtering that sequentially invokes more rigorous simulation as needed.

5. The method of claim 4 wherein *an* electromagnetic field from [the] diffraction of isolated edges is recycled in [the] synthesis of *a* near diffracted field for arbitrary two dimensional diffracting geometries.

6. The method of claim 5 wherein [the] *a* scattered field from all edges are summed to simulate light scattering [in] *by* the [two] *three* dimensional [objects] *object*.

7. The method of claim 6 wherein scattered light is polarized and [step c)] *applying edge domain decomposition* includes separate decomposition for light parallel to edges (TE) and for light perpendicular (TM) to edges.

8. The method of claim 7 wherein [step c)] *applying edge domain decomposition* includes pre-simulating all distinct edges in the object with all possible illumination directions and field polarizations.

9. The method of claim 8 *further comprising decomposing the three dimensional object into a plurality of the elementary two dimensional objects,* wherein [in step a)] the two dimensional objects comprise rectangles.

10. The method of claim 9 wherein the object is a phase shifting mask and [step c) of] pre-simulating light scattering from edges includes phase effects of etch depths in defining the phase shifting mask.

11. The method of claim 10 wherein the simulation of light scattering is based on [through the] *a* lens optical spectra.

12. The method of claim 10 wherein the simulation of light scattering is based on a raised cosine function for [the] optical spectra.

13. The method of claim 10 wherein the simulation of light scattering is based on a Gaussian function for [the] optical spectra.

14. The method of claim 10 wherein the simulation of light scattering is based on a rect-function for [the] optical spectra.

15. The method of claim 3 wherein the object is a phase shifting mask and [step c)] *applying edge domain decomposition* includes pre-simulating light scattering from edges *and* includes phase effects of etch depths in defining the phase shifting mask.

16. The method of claim 15 wherein scattered light is polarized and [step c)] includes separate decomposition for light parallel to edges [(TB)] (*TE*) and for light perpendicular (TM) to edges.

17. The method of claim 16 wherein [step c)] *applying edge domain decomposition* includes pre-simulating all distinct edges in the object with all possible illumination directions and field polarizations.

18. The method of claim 1 wherein [step c)] *applying edge domain decomposition* includes pre-simulating all distinct edges in the object with all possible illumination directions and field polarizations.

*19. A method comprising:*

*applying edge-domain decomposition to the a plurality of one-dimensional edges derived from a three-dimensional object to identify light scattering by the one-dimensional edges; and*

*using a computer, summing scattered light from the one-dimensional edges to simulate the light scattering by the three-dimensional object.*

*20. The method of claim 19, further comprising spectrally mapping the edge domain decomposition.*

*21. The method of claim 19, wherein the three dimensional object comprises a photo mask with multiple and interconnected openings.*

*22. The method of claim 19, wherein the applying edge-domain decomposition comprises using computational methods that speed up calculations by using lookup tables of previously calculated objects and filtering that sequentially invokes more rigorous simulation as needed.*

*23. The method of claim 19, wherein an electromagnetic field from diffraction of isolated edges is recycled in synthesis of a near diffracted field for arbitrary two-dimensional diffracting geometries.*

*24. The method of claim 19, wherein one or more scattered fields from the one-dimensional edges are summed to simulate the light scattering by the three-dimensional object.*

*25. The method of claim 19, wherein the scattered light is polarized and the applying edge-domain decomposition includes performing separate decompositions for light parallel to the one-dimensional edges (TE) and for light perpendicular (TM) to the one-dimensional edges.*

*26. The method of claim 19, wherein the applying edge-domain decomposition includes distinct edges in the three-dimensional object with one or more possible illumination directions and field polarizations.*

*27. The method of claim 26, wherein the three-dimensional object is a phase-shifting mask and the pre-simulating accounts for phase effects of etch depths in the phase shifting mask.*

*28. The method of claim 19, wherein two-dimensional objects defining the three-dimensional object comprise rectangles.*

*29. The method of claim 19, wherein the applying edge-domain decomposition is based on through-the-lens optical spectra.*

*30. The method of claim 19, wherein the applying edge-domain decomposition is based on a raised cosine function for optical spectra.*

*31. The method of claim 19, wherein the applying edge-domain decomposition is based on a Gaussian function for optical spectra.*

*32. The method of claim 19, wherein the applying edge-domain decomposition is based on a rect-function for optical spectra.*

*33. The method of claim 19, wherein:*

*the three-dimensional object is a phase shifting mask, and*

*the applying edge-domain decomposition includes pre-simulating light scattering from the one-dimensional edges and phase effects of etch depths in the phase shifting mask.*

*34. The method of claim 33, wherein:*

*the scattered light is polarized; and*

*the applying edge-domain decomposition includes performing separate decompositions for light parallel to the one-dimensional edges (TE) and for light perpendicular (TM) to the one-dimensional edges.*

*35. The method of claim 34, wherein the applying edge-domain decomposition includes pre-simulating distinct edges in the three-dimensional object with a plurality of possible illumination directions and field polarizations.*

*36. The method of claim 19, wherein the applying edge-domain decomposition includes pre-simulating distinct one-dimensional edges in the three-dimensional object with a plurality of pre-selected possible illumination directions and field polarizations.*

*37. A non-transitory computer-readable storage medium storing computer-executable instructions for causing a computer to perform a method comprising:*

*applying edge-domain decomposition to a plurality of one-dimensional edges composing a three-dimensional object to identify light scattering by the one-dimensional edges; and*

*summing scattered light from the one-dimensional edges to simulate the light scattering by the three-dimensional object.*

*38. The non-transitory computer-readable storage medium of claim 37, wherein the method further comprises spectrally mapping the edge domain decomposition.*

*39. The non-transitory computer-readable storage medium of claim 37, wherein the three dimensional object comprises a photo mask with multiple and interconnected openings.*

*40. The non-transitory computer-readable storage medium of claim 37, wherein the applying edge-domain decomposition comprises using computational methods that speed up calculations by using look-up tables of previously calculated objects and filtering that sequentially invokes more rigorous simulation as needed.*

*41. The non-transitory computer-readable storage medium of claim 37, wherein an electromagnetic field from diffraction of isolated edges is recycled in synthesis of a near diffracted field for arbitrary two-dimensional diffracting geometries.*

*42. The non-transitory computer-readable storage medium of claim 37, wherein one or more scattered fields from the one-dimensional edges are summed to simulate the light scattering by the three-dimensional object.*

*43. The non-transitory computer-readable storage medium of claim 37, wherein the scattered light is polarized and the applying edge-domain decomposition includes performing separate decompositions for light parallel to the one-dimensional edges (TE) and for light perpendicular (TM) to the one-dimensional edges.*

*44. The non-transitory computer-readable storage medium of claim 37, wherein the applying edge-domain decomposition includes pre-simulating distinct edges in the three-dimensional object with one or more possible illumination directions and field polarizations.*

*45. The non-transitory computer-readable storage medium of claim 37, wherein two-dimensional objects defining the three-dimensional object comprise rectangles.*

*46. The non-transitory computer-readable storage medium of claim 44, wherein the three-dimensional object is a phase-shifting mask and the pre-simulating accounts for phase effects of etch depths in the phase shifting mask.*

*47. The non-transitory computer-readable storage medium of claim 37, wherein the applying edge-domain decomposition is based on through-the-lens optical spectra.*

*48. The non-transitory computer-readable storage medium of claim 37, wherein the applying edge-domain decomposition is based on a raised cosine function for optical spectra.*

*49. The non-transitory computer-readable storage medium of claim 37, wherein the applying edge-domain decomposition is based on a Gaussian function for optical spectra.*

*50. The non-transitory computer-readable storage medium of claim 37, wherein the applying edge-domain decomposition is based on a rect-function for optical spectra.*

*51. The non-transitory computer-readable storage medium of claim 37, wherein:*

*the three-dimensional object is a phase shifting mask, and*

*the applying edge-domain decomposition includes pre-simulating light scattering from the one-dimensional edges and phase effects of etch depths in the phase shifting mask.*

*52. The non-transitory computer-readable storage medium of claim 51, wherein:*

*the scattered light is polarized, and*

*the applying edge-domain decomposition includes performing separate decompositions for light parallel to the one-dimensional edges (TE) and for light perpendicular (TM) to the one-dimensional edges.*

*53. The non-transitory computer-readable storage medium of claim 52, wherein the applying edge-domain decomposition includes pre-simulating distinct edges in the three-dimensional object with a plurality of possible illumination directions and field polarizations.*

*54. The non-transitory computer-readable storage medium of claim 37, wherein the applying edge-domain decomposition includes pre-simulating distinct one-dimensional edges in the three-dimensional object with a plurality of pre-selected possible illumination directions and field polarizations.*

*55. A method of simulating an aerial image projected by a multiple-opening mask having a plane defined by an X-axis and a Y-axis, comprising:*

*receiving layout data representing physical dimensions of one or more openings in the mask;*

*producing first scattered field data for a selected one of the openings using a first two-dimensional model oriented along the X-axis;*

*producing second scattered field data for the selected opening using a second two-dimensional model oriented along the Y-axis;*

*producing third scattered field data for the selected opening using a Kirchoff mask model; and*

*using a computer, producing composite scattered field data for the selected opening from the first scattered field data, the second scattered field data, and the third scattered field data.*

*56. The method of claim 55, wherein the layout data includes data concerning phase shift properties of the one or more openings.*

*57. The method of claim 55, wherein the layout data includes data concerning binary mask properties of the one or more openings.*

*58. The method of claim 55, wherein the X-axis is oriented in a TM direction for a polarized electromagnetic wave to be transmitted through the selected opening and the Y-axis is oriented in a TE direction for the polarized electromagnetic wave.*

*59. The method of claim 55, wherein the method further comprises decomposing the data representing the physical dimensions of the one or more openings into data defining the one or more openings as rectangles.*

*60. The method of claim 59, wherein the decomposing produces mutually disjoint rectangles.*

*61. The method of claim 55, further comprising performing optical proximity correction using the composite scattered field data.*

*62. The method of claim 55, further comprising performing die-to-database inspection using the composite scattered field data.*

*63. The method of claim 55, wherein the producing the composite scattered field data is performed by linearly combining the first scattered field data, the second scattered field data, and the third scattered field data.*

*64. The method of claim 55, wherein the first scattered field data and the second scattered field data are produced using pre-calculated values stored in one or more look-up tables.*

*65. A non-transitory computer-readable storage medium storing computer-executable instructions for causing a computer to perform a method of simulating an aerial image projected by a multiple-opening mask having a plane defined by an X-axis and a Y-axis, the method comprising:*

*receiving layout data representing physical dimensions of one or more openings in the mask;*

*producing first scattered field data for a selected one of the openings using a first two-dimensional model oriented along the X-axis;*

*producing second scattered field data for the selected opening using a second two-dimensional model oriented along the Y-axis;*

*producing third scattered field data for the selected opening using a Kirchoff mask model; and*

*producing composite scattered field data for the selected opening from the first scattered field data, the second scattered field data, and the third scattered field data.*

*66. The non-transitory computer-readable storage medium of claim 65, wherein the layout data includes data concerning phase shift properties of the one or more openings.*

*67. The non-transitory computer-readable storage medium of claim 65, wherein the layout data includes data concerning binary mask properties of the one or more openings.*

*68. The non-transitory computer-readable storage medium of claim 65, wherein the X-axis is oriented in a TM direction for a polarized electromagnetic wave to be transmitted through the selected opening and the Y-axis is oriented in a TE direction for the polarized electromagnetic wave.*

*69. The non-transitory computer-readable storage medium of claim 65, wherein the method further comprises decomposing the data representing the physical dimensions of the one or more openings into data defining the one or more openings as rectangles.*

*70. The non-transitory computer-readable storage medium of claim 69, wherein the decomposing produces mutually disjoint rectangles.*

*71. The non-transitory computer-readable storage medium of claim 65, wherein the method further comprises performing optical proximity correction using the composite scattered field data.*

*72. The non-transitory computer-readable storage medium of claim 65, wherein the method further comprises performing die-to-database inspection using the composite scattered field data.*

*73. The non-transitory computer-readable storage medium of claim 65, wherein the producing the composite scattered field data is performed by linearly combining the first scattered field data, the second scattered field data, and the third scattered field data.*

*74. The non-transitory computer-readable storage medium of claim 65, wherein the first scattered field data and the second scattered field data are produced using pre-calculated values stored in one or more look-up tables.*

*75. A method of performing optical proximity correction for a mask, comprising:*

*receiving layout data representing the mask, the layout data defining polygons and phase assignments;*

*assigning edge types to edges of one or more of the polygons, wherein the edge type for a respective edge is based at least in part on phase assignment data for an area adjacent to the respective edge;*

*simulating an aerial image produced by the mask using two-dimensional models for the edges of the one or more*

*polygons, wherein the two-dimensional models are selected based at least in part on the respective edge types of the edges and wherein the simulating produces edge image intensities; and*

*using a computer, modifying the layout data by applying an optical proximity correction method to the layout data using the aerial image.*

*76. The method of claim 75, wherein the edge type is one of a Cr-layer/0° edge, a Cr-layer/90° edge, a Cr-layer/270° edge, a 0°/90° edge, or a 0°/270° edge.*

*77. The method of claim 75, further comprising decomposing one or more of the polygons in the layout data into mutually disjoint rectangles.*

*78. The method of claim 75, wherein the polygons comprise non-Manhattan geometries.*

*79. The method of claim 75, wherein the aerial image is simulated as being produced by quadrupole illumination.*

*80. The method of claim 75, wherein the modifying includes adding one or more of an edge shift or a sub-resolution assist feature to the layout data.*

*81. The method of claim 75, wherein the simulating ignores corner effects.*

*82. The method of claim 75, wherein the simulating includes using one or more look-up tables to determine the aerial image.*

*83. The method of claim 82, wherein the one or more look-up tables are generated by calculating electromagnetic field solutions.*

*84. A non-transitory computer-readable storage medium storing computer-executable instructions for causing a computer to perform an optical proximity correction method for a mask, the method comprising:*

*receiving layout data representing the mask, the layout data defining polygons and phase assignments;*

*assigning edge types to edges of one or more of the polygons, wherein the edge type for a respective edge is based at least in part on phase assignment data for an area adjacent to the respective edge;*

*simulating an aerial image produced by the mask using two-dimensional models for the edges of the one or more polygons, wherein the two-dimensional models are selected based at least in part on the respective edge types of the edges and wherein the simulating produces edge image intensities; and*

*modifying the layout data by applying an optical proximity correction method to the layout data using the aerial image.*

*85. The non-transitory computer-readable storage medium of claim 84, wherein the edge type is one of a Cr-layer/0° edge, a Cr-layer/90° edge, a Cr-layer/270° edge, a 0°/90° edge, or a 0°/270° edge.*

*86. The non-transitory computer-readable storage medium of claim 84, wherein the method further comprises decomposing one or more of the polygons in the layout data into mutually disjoint rectangles.*

*87. The non-transitory computer-readable storage medium of claim 84, wherein the polygons comprise non-Manhattan geometries.*

*88. The non-transitory computer-readable storage medium of claim 84, wherein the aerial image is simulated as being produced by quadrupole illumination.*

*89. The non-transitory computer-readable storage medium of claim 84, wherein the modifying includes adding one or more of an edge shift or a sub-resolution assist feature to the layout data.*

*90. The non-transitory computer-readable storage medium of claim 84, wherein the simulating ignores corner effects.*

*91. The non-transitory computer-readable storage medium of claim 84, wherein the simulating includes using one or more look-up tables to determine the aerial image.*

*92. The non-transitory computer-readable storage medium of claim 91, wherein the one or more look-up tables are generated by calculating electromagnetic field.*

*93. A method of inspecting a mask, comprising:*

*receiving data produced by scanning a beam across a surface of the mask and imaging scattered electromagnetic fields that result from the scanning; and*

*comparing the received data to benchmark data, wherein the benchmark data is produced by applying an edge domain decomposition method (EDDM) to layout data representing the mask.*

*94. The method of claim 93, wherein the benchmark data is produced at substantially a same time as the scanning.*

*95. The method of claim 93, further comprising generating a database storing the benchmark data.*

*96. The method of claim 93, wherein the benchmark data represents a defect-free version of the mask.*

*97. The method of claim 93, further comprising outputting a signal indicating whether the mask is defective based on the comparing.*

*98. The method of claim 93, wherein the benchmark data includes data produced by:*

*defining a defect-free area of the mask;*

*simulating the defect-free area of the mask using the EDDM; and*

*simulating a defect within the defect-free area of the mask.*

*99. The method of claim 98, wherein the simulating a defect includes evaluating an aerial critical dimension (CD).*

*100. A non-transitory computer-readable storage medium storing computer-executable instructions for causing a computer to perform a method, the method comprising comparing received data to benchmark data, wherein the received data is produced at least in part by scanning a beam across a surface of a mask to produce a scattered electromagnetic field, and wherein the benchmark data is produced at least in part by applying an edge domain decomposition method (EDDM) to layout data representing the mask.*

*101. The non-transitory computer-readable storage medium of claim 100, wherein the benchmark data is produced at substantially a same time as the scanning.*

*102. The non-transitory computer-readable storage medium of claim 100, wherein the benchmark data is stored in a database.*

*103. The non-transitory computer-readable storage medium of claim 100, wherein the benchmark data represents a defect-free version of the mask.*

*104. The non-transitory computer-readable storage medium of claim 100, wherein the method further comprises, based on the comparing, outputting a signal indicating whether the mask is defective.*

*105. The non-transitory computer-readable storage medium of claim 100, wherein the benchmark data includes data produced by:*

*defining a defect-free area of the mask;*

*simulating the defect-free area of the mask using the EDDM; and*

*simulating a defect within the defect-free area of the mask.*

*106. The non-transitory computer-readable storage medium of claim 105, wherein the simulating a defect includes evaluating an aerial critical dimension (CD).*

*107. A method for simulating light scattering by a three-dimensional object in an optical imaging system, the method comprising:*

*applying edge-domain decomposition to the three-dimensional object to identify light scattering by one-dimensional edges that define the three-dimensional object; and*

*using a computer, summing scattered light from all the edges to simulate light scattering in two dimensions.*

* * * * *